United States Patent
Cartier, Jr. et al.

(10) Patent No.: US 9,022,806 B2
(45) Date of Patent: May 5, 2015

(54) PRINTED CIRCUIT BOARD FOR RF CONNECTOR MOUNTING

(71) Applicants: Marc B. Cartier, Jr., Dover, NH (US); David Manter, Windham, NH (US); Prescott B. Atkinson, Nottingham, NH (US); Philip T. Stokoe, Attleboro, MA (US); Thomas S. Cohen, New Boston, NH (US); Mark W. Gailus, Concord, MA (US)

(72) Inventors: Marc B. Cartier, Jr., Dover, NH (US); David Manter, Windham, NH (US); Prescott B. Atkinson, Nottingham, NH (US); Philip T. Stokoe, Attleboro, MA (US); Thomas S. Cohen, New Boston, NH (US); Mark W. Gailus, Concord, MA (US)

(73) Assignee: Amphenol Corporation, Wallingford Center, CT (US)

( * ) Notice: Subject to any disclaimer, the term of this patent is extended or adjusted under 35 U.S.C. 154(b) by 85 days.

(21) Appl. No.: 13/930,531

(22) Filed: Jun. 28, 2013

(65) Prior Publication Data
US 2014/0004724 A1 Jan. 2, 2014

Related U.S. Application Data

(60) Provisional application No. 61/666,674, filed on Jun. 29, 2012.

(51) Int. Cl.
*H01R 13/648* (2006.01)
*H01R 12/70* (2011.01)
*H01R 12/71* (2011.01)
(Continued)

(52) U.S. Cl.
CPC .......... *H01R 12/7082* (2013.01); *H01R 12/712* (2013.01); *H01R 43/20* (2013.01); *H01R 13/6587* (2013.01); *H05K 1/0222* (2013.01); *H05K 1/024* (2013.01); *H05K 1/0251* (2013.01); *H05K 2201/09063* (2013.01)

(58) Field of Classification Search
USPC .............. 439/607.01, 607.07, 607.05, 607.11
See application file for complete search history.

(56) References Cited

U.S. PATENT DOCUMENTS 6,152,747 A 11/2000 McNamara
6,293,827 B1 9/2001 Stokoe
(Continued)

FOREIGN PATENT DOCUMENTS

EP 2 437 358 A1 4/2012
KR 10-2004-0053391 A 6/2004
WO WO 2010/039188 A1 4/2010

OTHER PUBLICATIONS

International Search Report and Written Opinion for PCT/US2013/048582 mailed Oct. 22, 2013.

*Primary Examiner* — Phuong Dinh
(74) *Attorney, Agent, or Firm* — Wolf, Greenfield & Sacks, P.C.

(57) ABSTRACT

An RF connector module and associated printed circuit board providing high isolation and controlled impedance at RF frequencies. The connector module may be manufactured using conventional manufacturing techniques, such as stamping, insert molding, multi-shot molding and interference fit between components, to provide low cost. A connector module constructed with these techniques may implement a co-planar waveguide structure, with conductive shields for isolation and lossy material to enforce co-planar propagation modes. The printed circuit board may similarly be manufactured using conventional manufacturing techniques, including drilling to form vias. As a result, an interconnection system may be manufactured with low cost. These techniques may be applied to provide performance, including in the form of isolation between RF signals, comparable to that provided by more expensive components.

6 Claims, 15 Drawing Sheets

(51) Int. Cl.
  *H01R 43/20* (2006.01)
  *H01R 13/6587* (2011.01)
  *H05K 1/02* (2006.01)

(56) References Cited

U.S. PATENT DOCUMENTS

| | | |
|---|---|---|
| 6,503,103 B1 | 1/2003 | Cohen et al. |
| 6,641,410 B2 | 11/2003 | Marvin et al. |
| 6,709,294 B1 | 3/2004 | Cohen et al. |
| 6,776,659 B1 | 8/2004 | Stokoe et al. |
| 6,786,771 B2 | 9/2004 | Gailus |
| 7,163,421 B1 | 1/2007 | Cohen et al. |
| 7,371,117 B2 | 5/2008 | Gailus |
| 7,581,990 B2 | 9/2009 | Kirk et al. |
| 7,731,537 B2 * | 6/2010 | Amleshi et al. .......... 439/607.05 |
| 7,874,873 B2 * | 1/2011 | Do et al. ................. 439/607.35 |
| 2009/0011643 A1 | 1/2009 | Amleshi et al. |
| 2009/0149041 A1 | 6/2009 | Morlion et al. |
| 2009/0197483 A1 | 8/2009 | Do et al. |
| 2010/0291803 A1 | 11/2010 | Kirk |
| 2011/0104948 A1 | 5/2011 | Girard, Jr. et al. |
| 2011/0230095 A1 | 9/2011 | Atkinson et al. |

\* cited by examiner

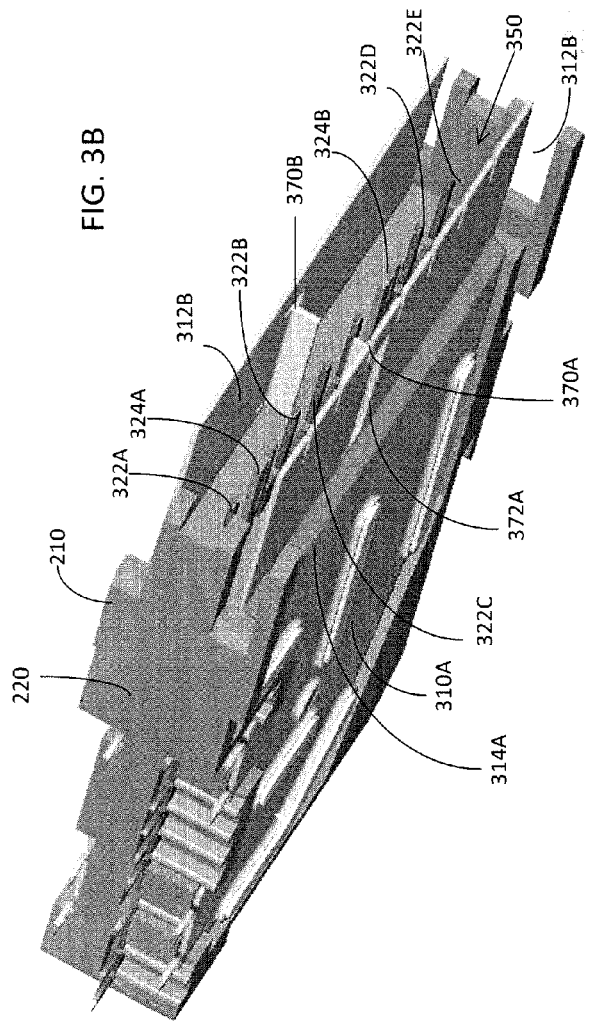
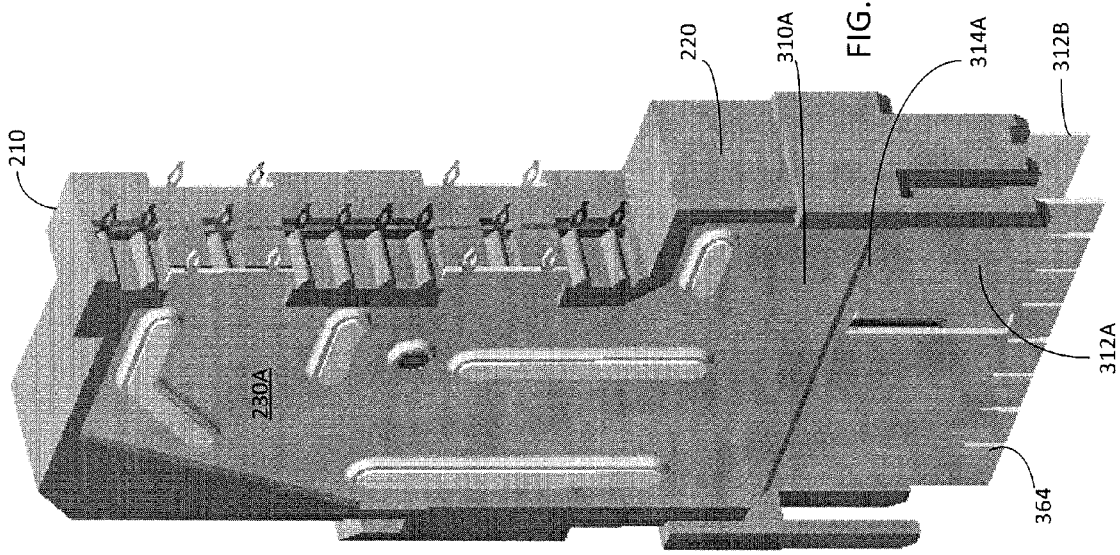

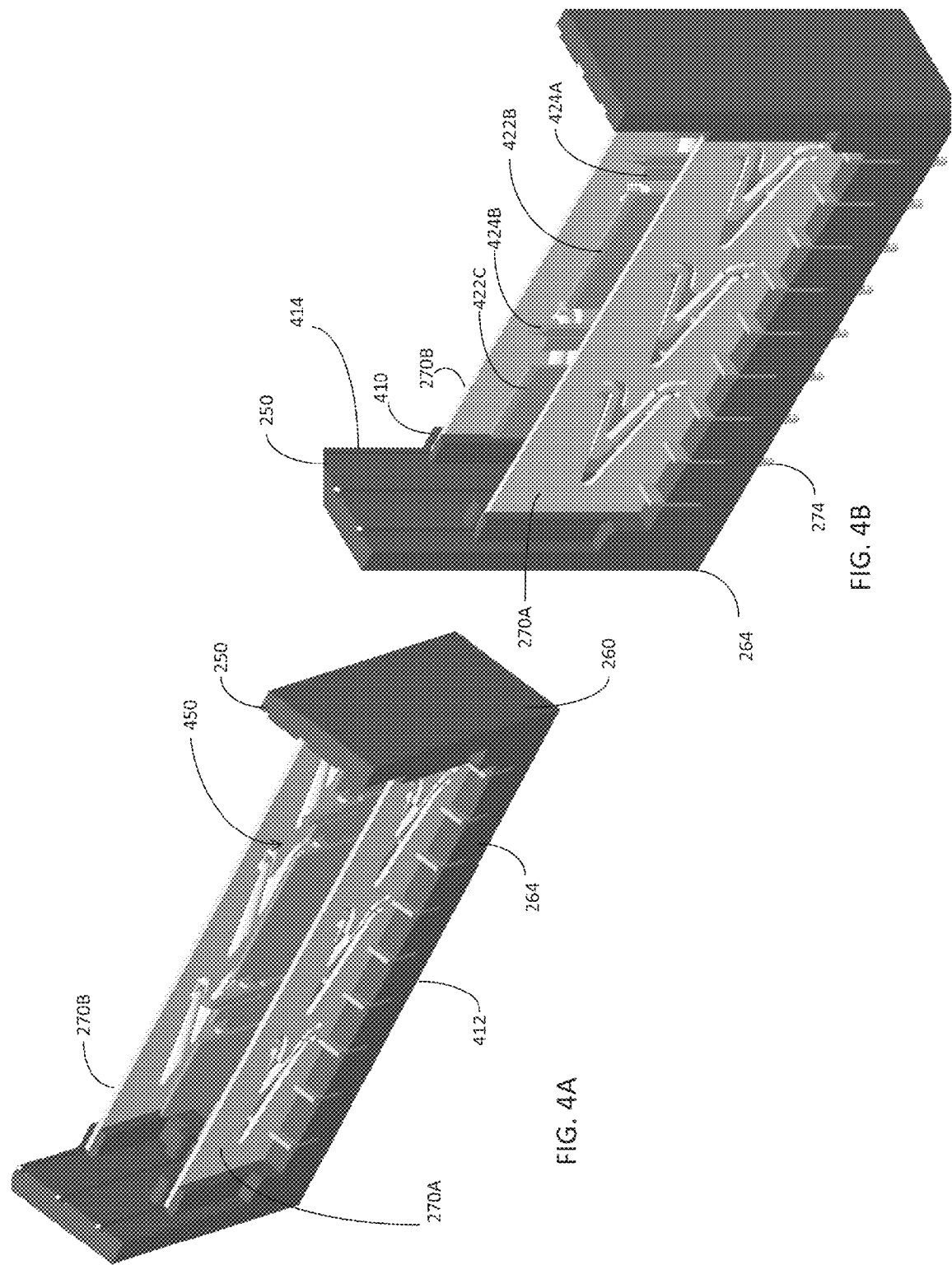

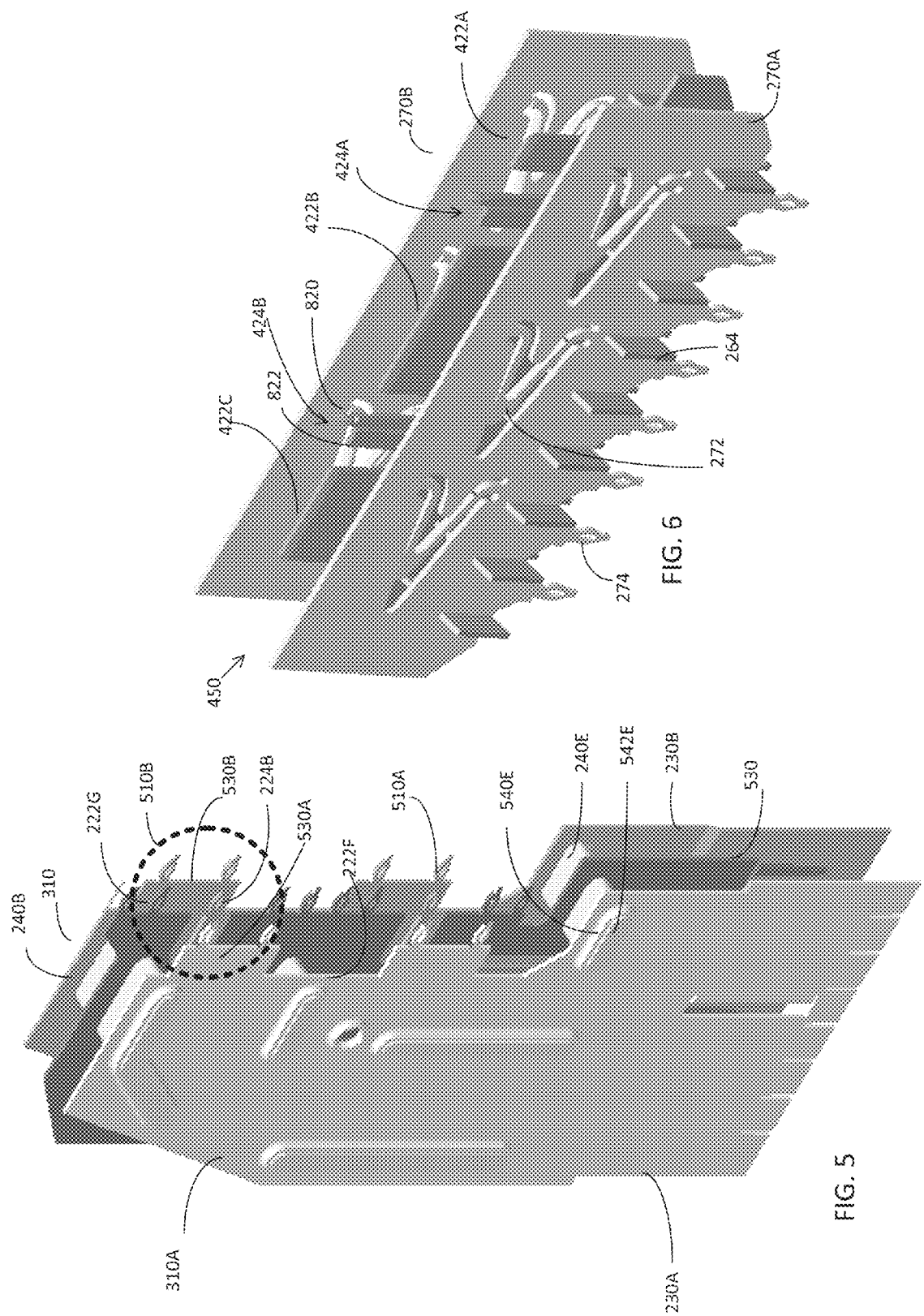

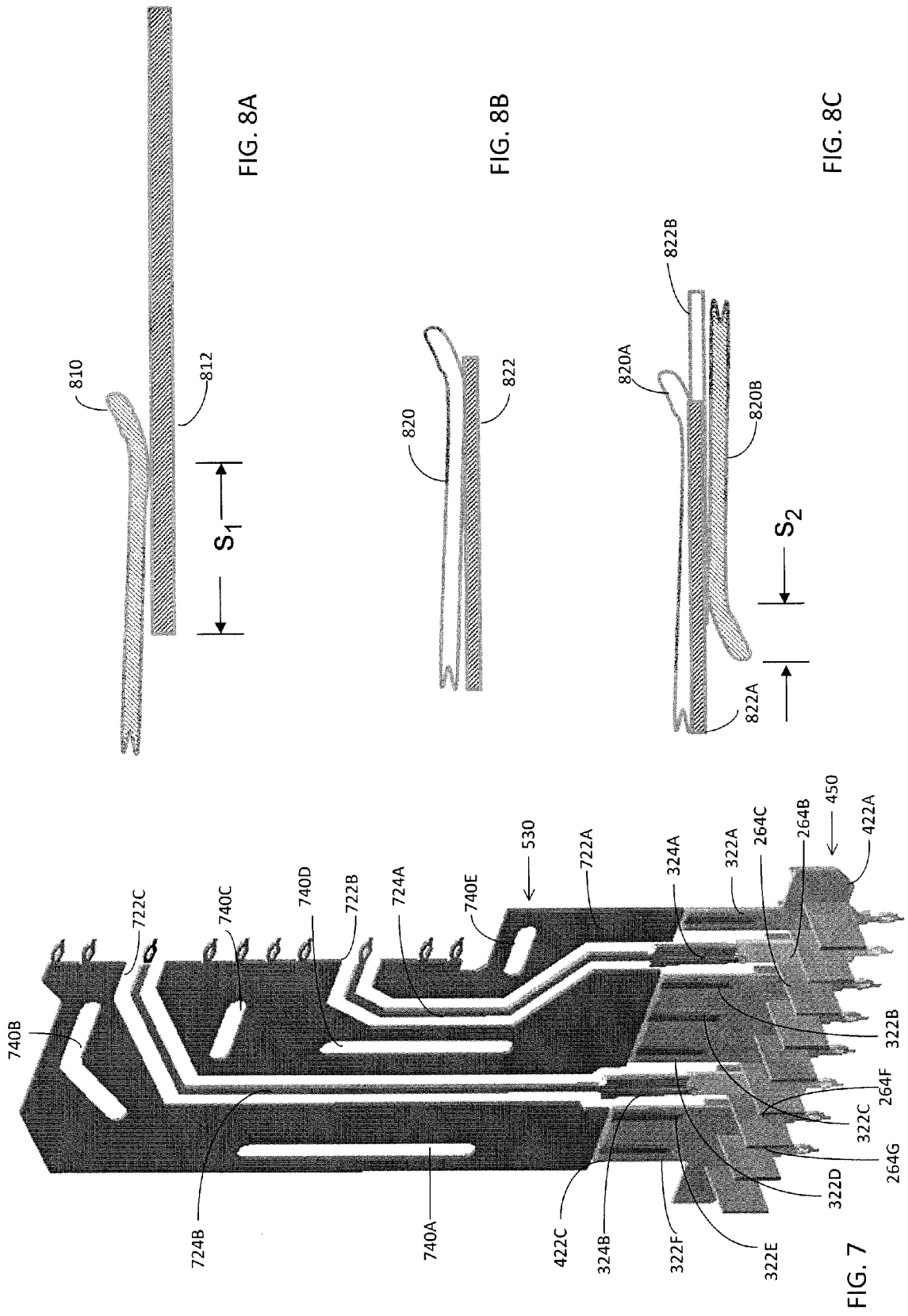

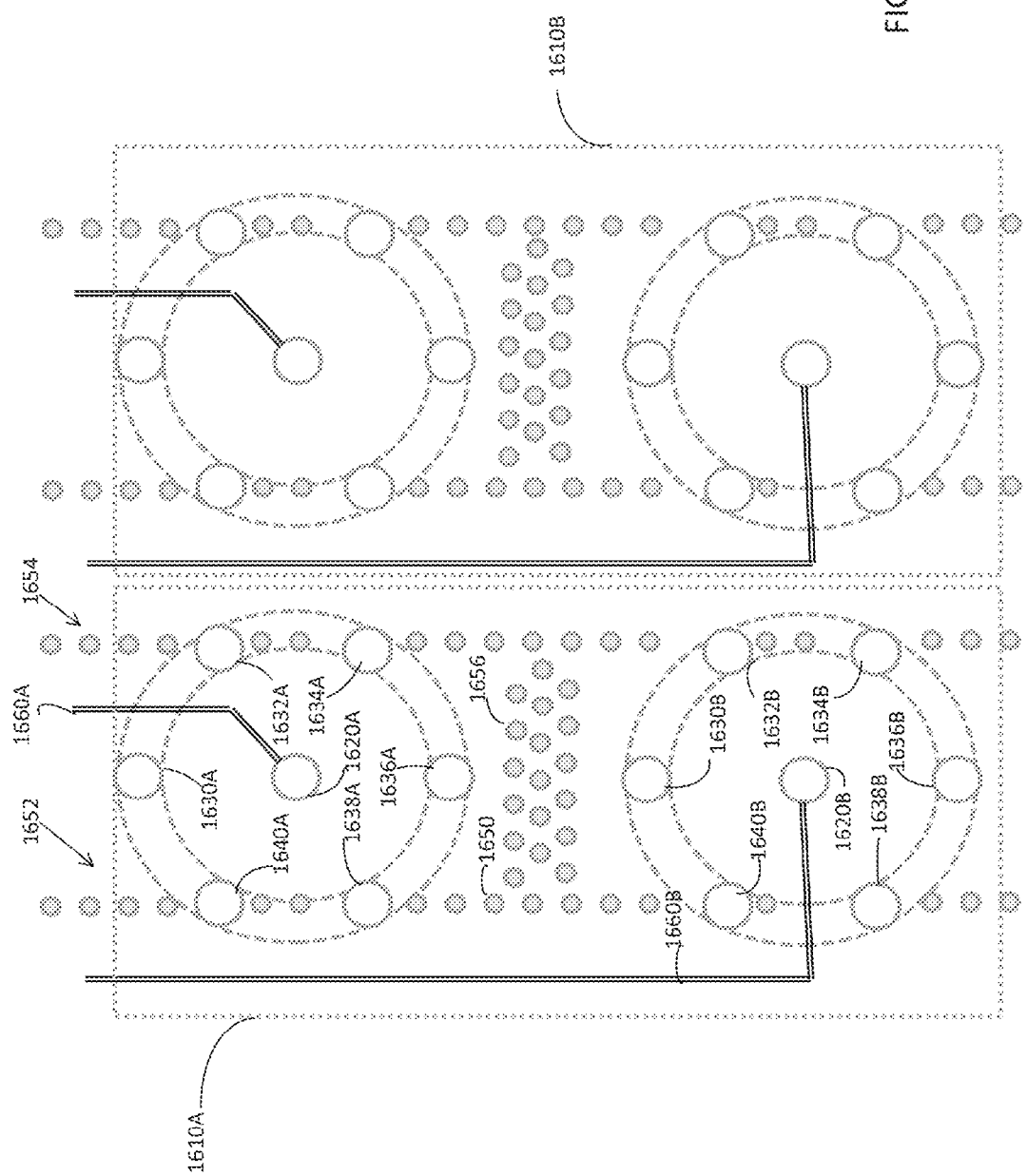

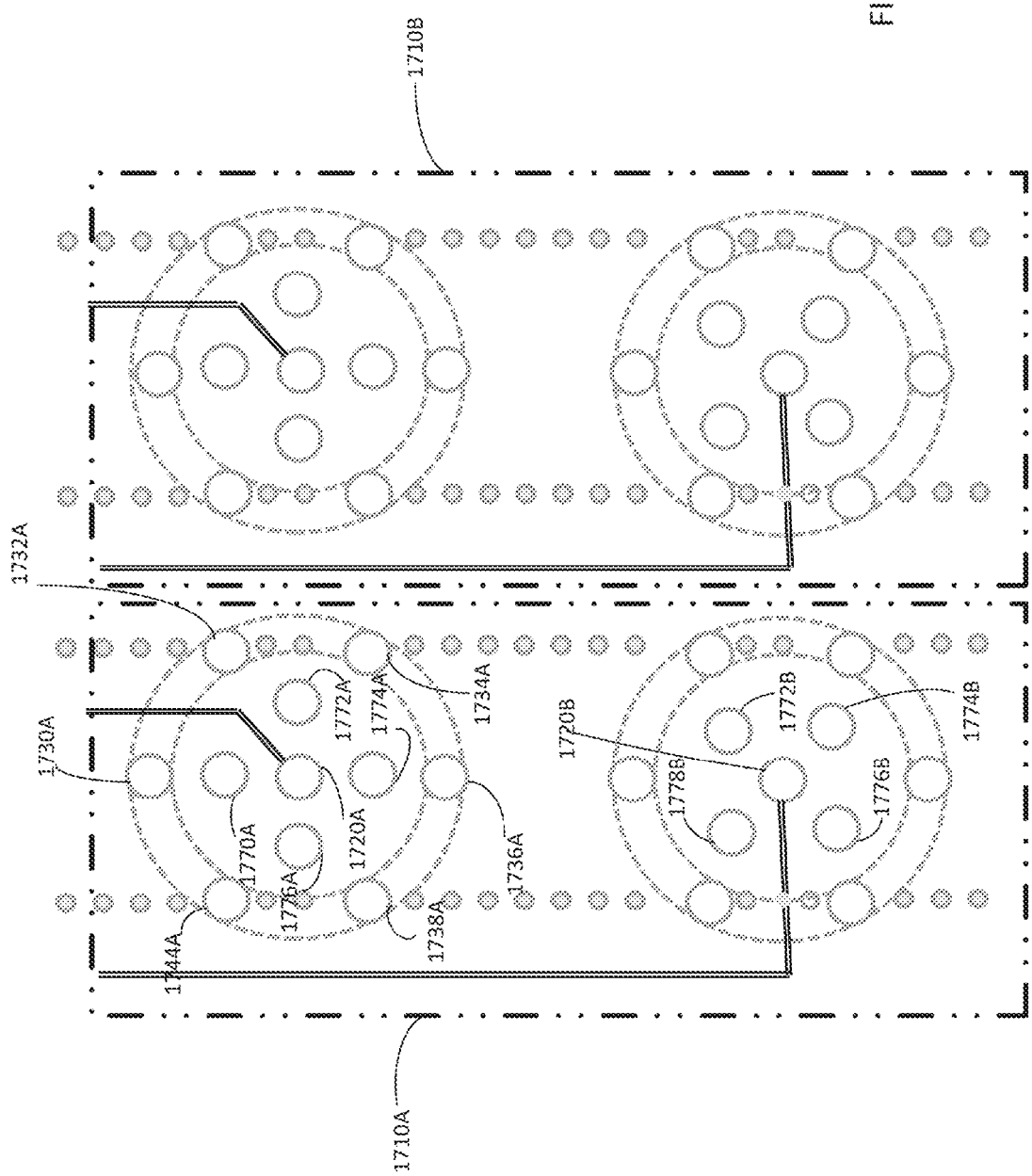

PRINTED CIRCUIT BOARD FOR RF CONNECTOR MOUNTING

RELATED APPLICATIONS

This application claims priority under 35 U.S.C. §119(e) to U.S. Provisional Application Ser. No. 61/666,674, entitled "LOW COST, HIGH PERFORMANCE RF CONNECTOR" filed on Jun. 29, 2012, which is herein incorporated by reference in its entirety.

BACKGROUND

The present disclosure relates generally to electrical interconnections for connecting printed circuit boards ("PCBs") and more specifically to interconnection systems for carrying RF signals between printed circuit boards.

Electrical connectors are used in many electronic systems. It is generally easier and more cost effective to manufacture a system on several PCBs that are connected to one another by electrical connectors than to manufacture a system as a single assembly. A traditional arrangement for interconnecting several PCBs is to have one PCB serve as a backplane. Other PCBs, which are called daughter boards or daughter cards, are then connected through the backplane by electrical connectors.

Connectors in different formats are used, depending on the types or orientations of PCBs to be connected. Some connectors are right angle connectors, meaning that they are used to join two printed circuit boards that are mounted in an electronic system at a right angle to one another. Another type of connector is called a mezzanine connector. Such a connector is used to connect printed circuit boards that are parallel to one another.

Examples of mezzanine connectors may be found in: U.S. patent application Ser. No. 12/612,510, published as US-2011-0104948-A1; International Application No. PCT/US2009/005275, published as International Publication No. WO/2010/039188; U.S. Pat. Nos. 6,152,747; and 6,641,410. All of these patents and patent applications are assigned to the assignee of the present application and are hereby incorporated by reference in their entireties.

Electronic systems have generally become smaller, faster and functionally more complex. These changes mean that the number of circuits in a given area of an electronic system, along with the data rates, sometimes measured as bits per second or as a frequency, at which the circuits operate, have increased significantly in recent years. Current systems pass more data between printed circuit boards and require electrical connectors that are electrically capable of handling more data at higher speeds than connectors of even a few years ago.

One of the difficulties in making a high density, high speed data connector is that electrical conductors in the connector can be so close that there can be electrical interference between adjacent signal conductors. To reduce interference, and to otherwise provide desirable electrical properties, metal members are often placed between or around adjacent signal conductors. The metal acts as a shield to prevent signals carried on one conductor from creating "crosstalk" on another conductor. The metal also impacts the impedance of each conductor, which can further contribute to desirable electrical properties.

As data rates increase, there is a greater possibility of electrical noise being generated in the connector in forms such as reflections, crosstalk and electromagnetic radiation. Therefore, the electrical connectors are designed to limit crosstalk between different signal paths and to control the characteristic impedance of each signal path. Shield members are often placed adjacent the signal conductors for this purpose.

Crosstalk between different signal paths through a connector can be limited by arranging the various signal paths so that they are spaced further from each other and nearer to a shield, such as a grounded plate. Thus, the different signal paths tend to electromagnetically couple more to the shield and less with each other. For a given level of crosstalk, the signal paths can be placed closer together when sufficient electromagnetic coupling to the ground conductors is maintained.

Although shields for isolating conductors from one another are typically made from metal components, U.S. Pat. No. 6,709,294, which is assigned to the same assignee as the present application and is hereby incorporated by reference in its entirety, describes making an extension of a shield plate in a connector from conductive plastic.

In some connectors, shielding is provided by conductive members shaped and positioned specifically to provide shielding. These conductive members are designed to be connected to a reference potential, or ground, when mounted on a printed circuit board. Such connectors are said to have a dedicated ground system.

In some connectors, designed for high frequency signals, each signal conductor may be surrounded by shielding. This configuration provides an electrical configuration similar to what occurs in a coaxial cable in which a center conductor, carrying a signal, runs through a tubular grounded sleeve, and is sometimes referred to as a coaxial configuration. An example of such a connector may be found in U.S. patent application Ser. No. 13/170,616 which is an example of a board to board connector with a coaxial structure.

Other techniques may be used to control the performance of a connector. For example, transmitting data signals differentially can also reduce crosstalk. Differential signals are carried by a pair of conducting paths, called a "differential pair." The voltage difference between the conductive paths represents the signal. In general, a differential pair is designed with preferential coupling between the conducting paths of the pair. For example, the two conducting paths of a differential pair may be arranged to run closer to each other than to adjacent signal paths in the connector. Conventionally, no shielding is desired between the conducting paths of the pair, but shielding may be used between differential pairs.

Examples of differential electrical connectors are shown in U.S. Pat. Nos. 6,293,827, 6,503,103, 6,776,659, and 7,163,421, all of which are assigned to the assignee of the present application and are hereby incorporated by reference in their entireties.

Electrical characteristics of a connector also may be controlled through the use of absorptive material. U.S. Pat. No. 6,786,771, which is assigned to the same assignee as the present application and which is hereby incorporated by reference in its entirety, describes the use of absorptive material to reduce unwanted resonances and improve connector performance, particularly at high speeds (for example, signal frequencies of 1 GHz or greater, particularly above 3 GHz). U.S. Pat. Nos. 7,371,117, 7,581,990, and U.S. patent application Ser. No. 13/029,052, published as US-2011-0230095-A1, which are assigned to the assignee of the present application and are hereby incorporated by reference in their entireties, describe the use of lossy material to improve connector performance.

Modern systems sometimes operate based on RF signals. RF signals might carry information representing video to be displayed or might carry information to an antenna for wireless transmission. Regardless of what information is carried by such a signal, passing RF signals through an interconnection system joining printed circuit boards can be challenging. The RF signals generally represent information in analog form, such that any distortion of the signal degrades the content of the information in the signal. In contrast, for a digital data signal, which at any given time represents a 1 or 0, so long as the noise or other distortion introduced into the signal is not so significant that it precludes a receiver from properly classifying the signal as a 1 or a 0, the noise has relatively little impact. The same amount of noise on an RF signal, however, might lead to perceptible distortion is the audio or video quality of the signal when it is rendered for a person or cause other undesired effects in a system using the RF signal.

To preserve the quality of an analog RF signal, it is known to make connectors to join printed circuit board to emulate a coaxial structure. Such connectors may be made of machined metal parts to provide a conductive ground structure surrounding a signal conductor throughout each RF signal path in the interconnection system.

SUMMARY

Aspects of the present disclosure relate to an improved, low cost, RF connector, which may be used as a substitute for a coaxial board-to-board connector. Such a connector may be provided using a connector module with a co-planar waveguide structure in the interior of the module. Dimensions of the elements of the co-planar waveguide may be established to provide a desired impedance, including for example 50Ω or 75Ω as is conventionally provided by an RF coax connector. Though, controlling impedance by varying dimensions of the co-planar waveguide allows impedance of the connector module to be customized without impacting design of other components such that a connector manufacturer may be able to provide a variety of RF connectors of many different impedances.

One or more construction techniques may be used to provide a high isolation between RF signal conductors in the connector module. Shielding may be provided at a peripheral portion of the module, spacing the shields sufficiently far from the signal conductors to provide minimal coupling of signal to the shields, which would otherwise increase crosstalk between RF signal conductors. Electrically lossy material may be incorporated to suppress parallel plate modes and enforce even mode propagation within the module.

Such a connector module may be simply and inexpensively manufactured using one or more manufacturing techniques, such as: stamping a lead frame to form the co-planar waveguide; embedding the lead frame in an insultative housing; adding lossy material to the insultative housing; and attaching planar shields to exterior surfaces of the module.

Such techniques may be used alone or in combination to achieve a connector module that provides in excess of 90 dB of isolation between signals at frequencies in excess of 5 GHz. A connector module with these characteristics may be used as a replacement for a conventional RF coaxial connector in many electronic assemblies.

Such a connector module may be attached to a printed circuit board with a footprint adapted to provide high isolation between signal conductors. The footprint may be formed using conventional printed circuit board manufacturing techniques, allowing for a low cost, though high performance, electronic assembly. The footprint may provide for relatively high isolation between RF signal conductors, even if those signal conductors are routed on the same layer of a printed circuit board.

In other aspects, a two-piece connector may be provided with signal conductors that have similar, but inverted shapes configured to reduce stub length and improve performance of the connector. In some embodiments, a signal conductor may have a mating contact portion with a distal end with a planar portion and a beam portion. The signal conductors may be oriented such that the beam portion of a mating contact in one connector piece mates with the planar portion of the mating contact in the other connector piece. This arrangement provides multiple points of contact along the mating contact portion.

Other advantages and novel features will become apparent from the following detailed description of various non-limiting embodiments of the present disclosure when considered in conjunction with the accompanying figures and from the claims. Accordingly, the claims should not be limited by the foregoing summary.

BRIEF DESCRIPTION OF DRAWINGS

The accompanying drawings are not intended to be drawn to scale. For purposes of clarity, not every component may be labeled in every drawing.

FIG. 3A is a left side perspective view of the right angle RF connector module of FIGS. 2A and 2B;

FIG. 3B is a perspective view, from the mating interface end, of the right angle RF connector module of FIGS. 2A and 2B;

FIGS. 4A and 4B are perspective views of the corresponding backplane RF connector module of FIGS. 2A and 2B;

FIG. 5 is a left side, partially cut away perspective view of the right angle RF connector module of FIGS. 2A and 2B, with the insulative housing cut away to reveal conductive elements and lossy regions within the connector module;

FIG. 6 is a partially cutaway perspective view of the corresponding backplane RF connector module of FIGS. 2A and 2B, with insulative portions cutaway to reveal conductive elements within the corresponding connector module;

FIG. 7 is a perspective view of conductive elements of the right angle RF connector of FIGS. 2A and 2B shown engaging mating conductive elements of the corresponding connector module of FIGS. 2A and 2B;

FIGS. 8A, 8B and 8C are cross-sectional illustrations of alternative embodiments of the meeting contact portions of the conductive elements illustrated in FIG. 7;

FIG. 16 is a plan view of a signal launch regions for RF signals adapted for attachment of a connector module as in FIGS. 2A and 2B; and FIG. 17 is a plan view of an alternative embodiment of the signal launch regions of FIG. 16, with tuning for RF signals.

DETAILED DESCRIPTION

Figure 1:
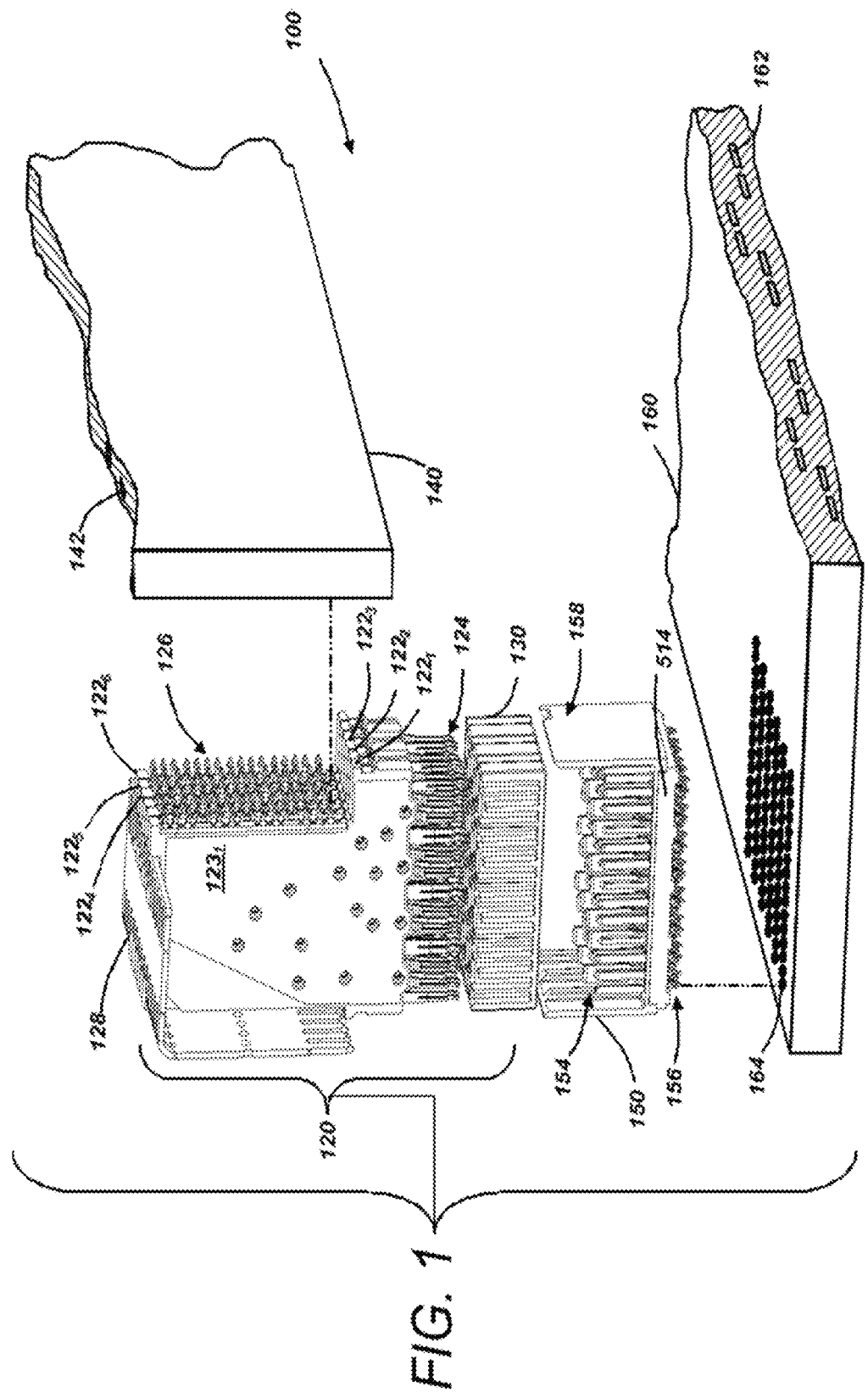
FIG. 1 is a perspective view of a first connector suitable for carrying data signals in an interconnection system in combination with an RF connector as described herein.

The inventors have recognized and appreciated ways to combine known manufacturing techniques to manufacture a low cost, high performance interconnection system that carries RF signals. The system may be manufactured using one or more connector modules adapted for carrying RF signals. The RF connector modules may be manufactured using techniques compatible with those used for manufacturing high speed data connectors. However, the RF connector modules may carry signals at RF frequencies with very high isolation. As a specific example, a connector module as described herein may provide greater than 90 dB of isolation between RF signal conductors at 5 GHz.

In some embodiments, a connector module may be manufactured using stamping and molding techniques as are known in the art for manufacture of high speed data connectors. These operations may be low cost in comparison to screw turning and other techniques known in the art for making a coaxial connector. As in a data connector, a lead frame with conductive elements may be stamped from a sheet of metal, resulting in conductive elements arranged in a column. However, for an RF connector, the conductive elements may be stamped to provide conductive elements that carry RF signals.

Conductive elements providing ground conductors may be stamped adjacent these signal conductors. The stamping may provide for a single signal conductor between adjacent ground conductors, supporting single-ended RF signal paths. Any number of such signal paths may be provided in a lead frame. In some embodiments, for example, two RF signal paths may be provided in a lead frame.

In some embodiments, the lead frame may be stamped to provide for a co-planar waveguide structure. In such a structure, signal conductors are positioned adjacent ground conductors. An RF signal may propagate along the signal conductor as an electromagnetic field primarily concentrated between the signal conductor and adjacent ground conductors. Accordingly, dimensions of the signal conductor and spacing relative to adjacent ground conductors may primarily determine the impedance of the signal conductor at RF frequencies.

The lead frame may be held within a support structure, referred to herein as a housing. The housing may be partially or totally insultative.

In some embodiments, planar conductive members or shield members of other shapes may also be supported by the housing. The shield members also may be stamped from a sheet of metal. They may be attached to an exterior portion of the housing or incorporated into the module in any suitable way. In some embodiments, there may be more than one planar conductive member per module, and the manner conductive members may be collectively configured to provide shielding between RF signal conductors, whether in the same module or, when multiple modules are used, adjacent modules.

In some embodiments, the shield members may be spaced sufficiently far from the lead frame that the presence or shape of the shield members does not significantly impact the impedance of the RF signal conductor.

The housing, in addition to supporting the lead frame, may support regions of lossy material. The lossy material may be positioned within the housing to enforce propagation of the signal in accordance with the co-planar structure. The lossy material, for example, may be positioned to suppress undesired modes of propagation. In structures with multiple conductors, these structure may support multiple modes of electromagnetic energy. The number of modes supported in a structure relates on the number of conductors, such that there are n−1 modes of propagation for n conductors. In the case of connector with a signal conductor and two ground conductors, there are three conductors, so two modes of propagation. The lossy material may be positioned to dampen the mode that has lesser contribution to energy transmitted through the connector or, conversely, causes greater interference on other conductors. For two signal conductors and three ground conductors, there are four modes supported. Lossy material may be positioned to dampen one or more of these modes. In some embodiments, the TEM mode of propagation may be desired such that the lossy material is positioned to suppress non-TEM modes.

As another example, the lossy material also may be positioned to suppress parallel plate modes of propagation between the lead frame and the shield members. Such a structure may be simply manufactured by inserting lossy regions into the housing.

Shield members may then be attached to exterior surfaces of the housing. In some embodiments, the shield members may be electrically coupled through the lossy regions. Both mechanical attachment and electrical coupling may be provided by pressing the shield members against the surface such that the lossy regions extend through openings in the shield members. Mechanical attachment may be achieved by sizing the openings relative to the lossy regions such that an interference fit is created. In some embodiments, the lossy material may also contact the ground conductors of the lead frame, tying together the grounded conductive elements within the connector module.

Performance of an interconnection system incorporating such an RF connector module may be enhanced through the use of printed circuit boards that are adapted for use with the connector modules. Such a printed circuit board, for example, may have multiple layers, but may be configured to have traces carrying RF signals to the signal conductors of the RF connector module on a single layer of the printed circuit board. Moreover, the printed circuit board may be configured so as to tune the impedance of the signal launch where the RF connector module is mounted to the printed circuit board. Alternatively or additionally, the printed circuit board may be configured to provide isolation between the RF signal traces, such as through the use of micro vias.

In some embodiments, the RF connector modules manufactured as described herein may be physically sized for use with connector modules carrying data signals. FIG. 1 provides an example of an interconnection system using known data connectors into which RF connector modules may be incorporated.

FIG. 1 shows an illustrative electrical interconnection system 100 having two data connectors. In this example, the electrical interconnection system 100 includes a daughter card connector 120 and a backplane connector 150 adapted to mate with each other to create electrically conducting paths between a backplane 160 and a daughter card 140. Though not expressly shown, the interconnection system 100 may interconnect multiple daughter cards having similar daughter card connectors that mate to similar backplane connectors on the backplane 160. Accordingly, aspects of the present disclosure are not limited to any particular number or types of subassemblies connected through an interconnection system. Furthermore, although the illustrative daughter card connector 120 and the illustrative backplane connector 150 form a right-angle connector, it should be appreciated that aspects of the present disclosure are not limited to the use of right-angle connectors. In other embodiments, an electrical interconnection system may include other types and combinations of connectors, as the inventive concepts disclosed herein may be broadly applied in many types of electrical connectors, including, but not limited to, right angle connectors, mezzanine connectors, card edge connectors, cable connectors and chip sockets.

In the example shown in FIG. 1, the backplane connector 150 and the daughter connector 120 each contain conductive elements. The conductive elements of the daughter card connector 120 may be coupled to traces (of which a trace 142 is numbered), ground planes, and/or other conductive elements within the daughter card 140. The traces may carry electrical signals, while the ground planes may provide reference levels for components on the daughter card 140. Such a ground plane may have a voltage that is at earth ground, or positive or negative with respect to earth ground, as any voltage level maybe used as a reference level.

Similarly, conductive elements in the backplane connector 150 may be coupled to traces (of which trace 162 is numbered), ground planes, and/or other conductive elements within the backplane 160. When the daughter card connector 120 and the backplane connector 150 mate, the conductive elements in the two connectors complete electrically conducting paths between the conductive elements within the backplane 160 and the daughter card 140.

In the example of FIG. 1, the backplane connector 150 includes a backplane shroud 158 and a plurality of conductive elements that extend through a floor 514 of the backplane shroud 158 with portions both above and below the floor 514. The portions of the conductive elements that extend above the floor 514 form mating contacts, shown collectively as mating contact portions 154, which are adapted to mate with corresponding conductive elements of the daughter card connector 120. In the illustrated embodiment, the mating contacts portions 154 are in the form of blades, although other suitable contact configurations may also be employed, as aspects of the present disclosure are not limited in this regard.

The portions of the conductive elements that extend below the floor 514 form contact tails, shown collectively as contact tails 156, which are adapted to be attached to backplane 160. In the example shown in FIG. 1, the contact tails 156 are in the form of press fit, "eye of the needle," compliant sections that fit within via holes, shown collectively as via holes 164, on the backplane 160. However, other configurations may also be suitable, including, but not limited to, surface mount elements, spring contacts, and solderable pins, as aspects of the present disclosure are not limited in this regard.

In the embodiment illustrated in FIG. 1, the daughter card connector 120 includes a plurality of wafers $122_1$, $122_1$, ... $122_6$ coupled together, each wafer having a housing (e.g., a housing $123_1$ of the wafer $122_1$) and a column of conductive elements disposed within the housing. Some conductive elements in the column may be adapted for use as signal conductors, while some other conductive elements may be adapted for use as ground conductors. The ground conductors may be employed to reduce crosstalk between signal conductors or to otherwise control one or more electrical properties of the connector.

In the illustrated embodiment, the daughter card connector 120 is a right angle connector and has conductive elements that traverse a right angle. As a result, opposing ends of the conductive elements extend from perpendicular edges of the wafers $122_1$, $122_1$, ... $122_6$. For example, contact tails of the conductive elements of the wafers $122_1$, $122_1$, ... $122_6$, shown collectively as contact tails 126, extend from side edges of the wafers $122_1$, $122_1$, ... $122_6$ and are adapted to be connected to the daughter card 140. Opposite from the contact tails 126, mating contacts of the conductive elements, shown collectively as mating contact portions 124, extend from bottom edges of the wafers $122_1$, $122_1$, ... $122_6$ and are adapted to be connected corresponding conductive elements in the backplane connector 150. Each conductive element also has an intermediate portion between the mating contact portion and the contact tail, which may be enclosed by or embedded within the housing of the wafer (e.g., the housing $123_1$ of the wafer $122_1$).

The contact tails 126 may be adapted to electrically connect the conductive elements within the daughter card connector 120 to conductive elements (e.g., the trace 142) in the daughter card 140. In the embodiment illustrated in FIG. 1, contact tails 126 are press fit, "eye of the needle" contacts adapted to make an electrical connection through via holes in the daughter card 140. However, any suitable attachment mechanism may be used instead of, or in addition to, via holes and press fit contact tails.

In the example illustrated in FIG. 1, each of the mating contact portions 124 has a dual beam structure configured to mate with a corresponding one of the mating contact portions 154 of the backplane connector 150. However, it should be appreciated that aspects of the present disclosure are not limited to the use of dual beam structures. For example, some or all of the mating contact portions 124 may have a triple beam structure. Other types of structures, such as single beam structures, may also be suitable. Furthermore, a mating contact portion may have a wavy shape adapted to improve one or more electrical and/or mechanical properties and thereby improve the quality of a signal coupled through the mating contact portion.

In the example of FIG. 1, some conductive elements of the daughter card connector 120 are intended for use as signal conductors, while some other conductive elements of the daughter card connector 120 are intended for use as ground conductors. The signal conductors may be grouped in pairs that are separated by the ground conductors, in a configuration suitable for carrying differential signals. Such pairs may be designated as "differential pairs", as understood by one of skill in the art. For example, though other uses of the conductive elements may be possible, a differential pair may be identified based on preferential coupling between the conductive elements that make up the pair. Electrical characteristics of a pair of conductive elements, such as impedance, that make the pair suitable for carrying differential signals may provide an alternative or additional method of identifying the pair as a differential pair. Furthermore, in a connector with differential pairs, ground conductors may be identified by their positions relative to the differential pairs. In other instances, ground conductors may be identified by shape and/or electrical characteristics. For example, ground conductors may be relatively wide to provide low inductance, which may be desirable for providing a stable reference potential, but may provide an impedance that is undesirable for carrying a high speed signal.

While a connector with differential pairs is shown in FIG. 1 for purposes of illustration, it should be appreciated that embodiments are possible for single-ended use in which conductive elements are evenly spaced without designated ground conductors separating designated differential pairs, or with designated ground conductors between adjacent designated signal conductors.

In the embodiment illustrated in FIG. 1, the daughter card connector 120 includes six wafers $122_1, 122_1, \ldots 122_6$, each of which has a plurality of pairs of signal conductors and a plurality ground conductors arranged in a column in an alternating fashion. Each of the wafers $122_1, 122_2, \ldots 122_6$ is inserted into a front housing 130 such that the mating contact portions 124 are inserted into and held within openings in the front housing 130. The openings in the front housing 130 are positioned so as to allow the mating contact portions 154 of the backplane connector 150 to enter the openings in the front housing 130 and make electrical connections with the mating contact portions 124 when the daughter card connector 120 is mated with the backplane connector 150.

In some embodiments, the daughter card connector 120 may include a support member instead of, or in addition to, the front housing 130 to hold the wafers $122_1, 122_2, \ldots 122_6$. In the embodiment shown in FIG. 1, a stiffener 128 is used to support the wafers $122_1, 122_2, \ldots 122_6$. The stiffener 128 may be made of stamped metal, or any other suitable material, and may be stamped with slots, holes, grooves and/or any other features for engaging a plurality of wafers to support the wafers in a desired orientation. However, it should be appreciated that aspects of the present disclosure are not limited to the use of a stiffener. Furthermore, although the stiffener 128 in the example of FIG. 1 is attached to upper and side portions of the plurality of wafers, aspects of the present disclosure are not limited to this particular configuration, as other suitable configurations may also be employed.

In some further embodiments, each of the wafers $122_1, 122_2, \ldots 122_6$ may include one or more features for engaging the stiffener 128. Such features may function to attach the wafers $122_1, 122_2, \ldots 122_6$ to the stiffener 128, to locate the wafers with respect to one another, and/or to prevent rotation of the wafers. For instance, a wafer may include an attachment feature in the form of a protruding portion adapted to be inserted into a corresponding slot, hole, or groove formed in the stiffener 128. Other types of attachment features may also be suitable, as aspects of the present disclosure are not limited in this regard.

In the embodiment illustrated, the wafers, when inserted into front housing 130 form a connector module. Such connector module is adapted for carrying high-speed data signals. When attached to stiffener 128, such a connector module may form a portion of an overall connector. That connector may include other modules adapted for carrying high-speed data signals. Alternatively or additionally, the connector may include other types of modules attached to stiffener 128, including an RF connector module.

Figure 2B:
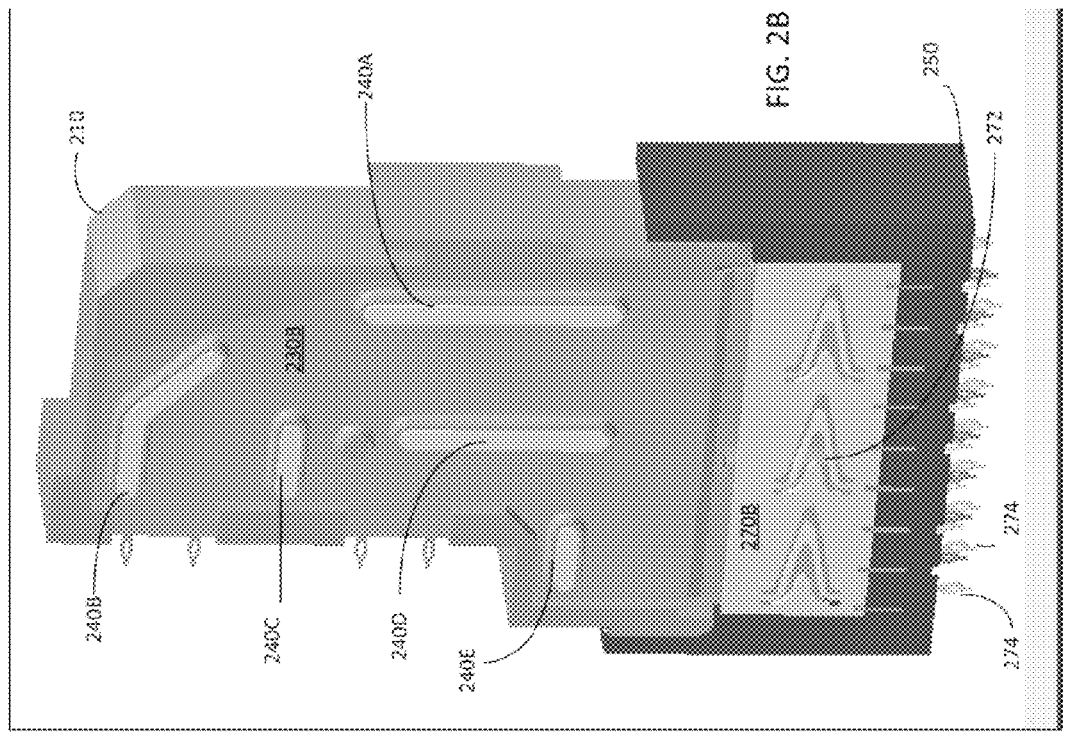
FIGS. 2A and 2B are left and right side perspective views, respectively, of an exemplary embodiment of a right angle RF connector module mated with a corresponding backplane RF connector module.
Figure 2A:
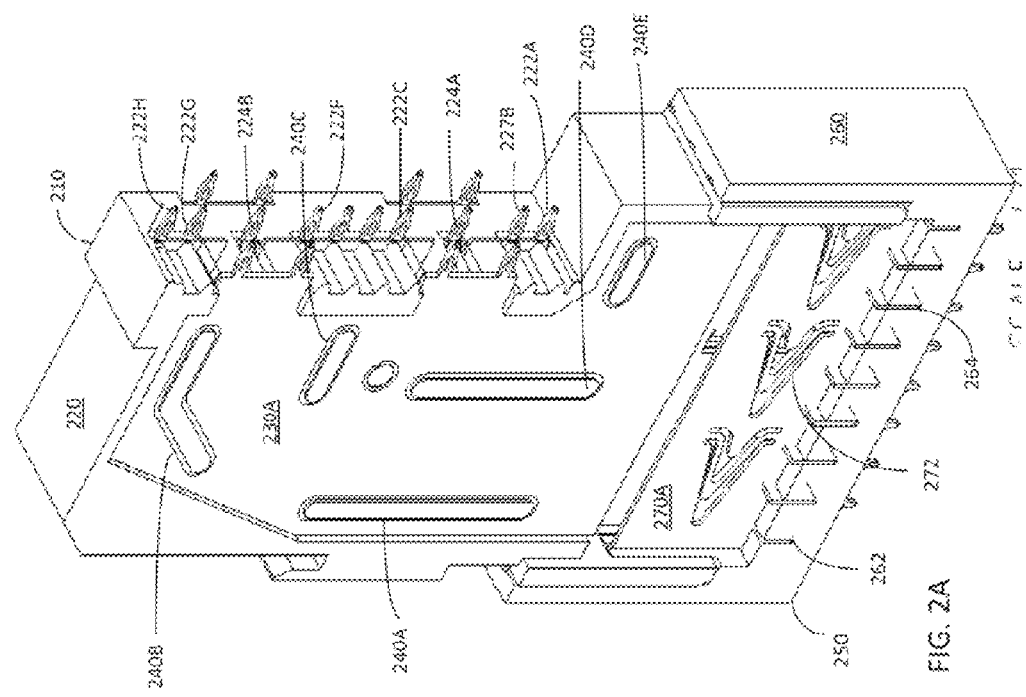

FIGS. 2A and 2B illustrate a right angle RF connector module 210 that is sized for attachment to stiffener 128. In the configuration shown, RF connector module 210 is shown mated to a corresponding backplane RF connector module 250. In use, RF connector module 210 may be mounted to stiffener 128 adjacent other like RF connector modules, adjacent data connector modules as illustrated in FIG. 1 or connector modules of other types. Similarly, backplane RF connector module 250 may be attached to backplane 160 adjacent backplane module 150 or other suitable type of backplane module. Though, it should be appreciated that the RF connector modules as described herein may be used as part of a connector with or without high-speed data connector modules.

FIG. 2A is a left side, perspective view of a right angle, RF connector module 210 mated with backplane RF connector module 250. FIG. 2B is a right side, perspective view of RF connector module 210 and backplane RF connector module 250. As with the high-speed data connector illustrated in FIG. 1, right angle, RF connector module 210 includes an insulative housing 220.

In this example, housing 220 has exterior dimensions and features conforming to those of the high-speed data connector of FIG. 1 such that RF connector module 210 may be mounted to stiffener 128 along with high-speed data connector modules. Though, RF connector module 210 may have a different width (in a direction along stiffener 128) than the connector module illustrated in FIG. 1. The width of RF connector module 210 may be selected to approximate an integer multiple of the width of the wafers in FIG. 1. Such a width may facilitate attaching one or more RF connector modules to stiffener 128, but is not a requirement of the invention.

Housing 220 may be made of any suitable material. Suitable materials include insulative materials known in the art for use in forming electrical connector housings. The material may be thermoplastic to facilitate forming housing 220 using a molding operation. In the embodiment illustrated, housing 220 is molded from a dielectric material such as plastic or nylon. Examples of suitable materials are liquid crystal polymer (LCP), polyphenyline sulfide (PPS), high temperature nylon or polypropylene (PPO). Other suitable materials may be employed, as the present invention is not limited in this regard. All of these may be suitable for use as binder materials in manufacturing connectors according to some embodiments of the invention. One or more fillers may be included in some or all of the binder material used to form housing 220 to control the mechanical properties of housing 220. For example, thermoplastic PPS filled to 30% by volume with glass fiber may be used to form housing 220. Fillers to control the electrical properties of regions of the backplane connector may also be used.

Regardless of the material used to form housing 220, conductive elements may be positioned within housing 220. The conductive elements may be shaped to act as RF signal conductors and/or ground conductors. The signal and ground conductors may be sized and positioned relative to each other to provide a desired impedance for RF signals passing through RF connector module 210.

In the view shown in FIG. 2A, intermediate portions of the conductive elements within housing 220 are not visible. However, contact tails extending from the intermediate portions of the conductive elements within housing 220 are visible. Contact tails 224A and 224B are contact tails for RF signal conductors. Contact tails 222A, 222B ... 222H are contact tails for ground conductors.

Any suitable technique may be used to manufacture RF connector module 210 with intermediate portions of the conductive elements within housing 220. An example of a suitable techniques is insert molding. In accordance with such a technique, the conductive elements may be stamped from a sheet of metal as a single lead frame, which may include tie bars and carrier strips that hold the conductive elements together for handling as a single component. Insulative material forming housing 220 may then be molded around the lead frame using insert molding techniques as are known in the art. Once the conductive elements of the lead frame are held with in the housing 220, the conductive elements may be separated from carrier strips or other supporting portions of the lead frame. Though, the specific technique for incorporating conductive elements within housing 220 is not critical to the invention. In some embodiments, for example, housing 220 may be formed in multiple pieces. The conductive elements may then be placed within or attached to one of the pieces. The pieces of the housing may be attached to each other, leaving the conductive elements within the housing.

FIGS. 2A and 2B illustrate other elements that may be included in right angle, RF connector module 210. FIG. 2A shows a shield member 230A attached to a left side of RF connector module 210. FIG. 2B shows a shield member 230B attached to a right side of connector module 210. In this example, shield members 230A and 230B have generally planar shapes. Accordingly, each of the shield members 230A and 230B may be attached to a surface of insulative housing 220.

Any suitable attachment technique may be used to attach shield members 230A and 230B to insulative housing 220. In the example illustrated in FIGS. 2A and 2B, mechanical attachment of the shield members is achieved by an interference fit between the shield members and portions of the housing extending above the outer surface to which the shield members are attached. Those extending regions may be partially or totally conductive such that, in addition to a mechanical attachment, electrical connections to the shield members may be formed.

FIGS. 2A and 2B show lossy regions 240A, 240B ... 240E. Portions of those lossy regions extend above the outer surface of insulative housing 220. The extending portions align with openings in the shield members 230A and 230B. Those extending portions of the lossy regions may have dimensions slightly larger than the dimensions of openings in the shield members. Accordingly, when the shield members are pressed against the surface, the lossy regions 240A, 240B ... 240E may be deformed to pass through the openings. The portions of the lossy regions that pass through the openings may expand, capturing the shield plates against the surfaces of insultative housing 220.

The lossy regions 240A, 240B ... 240E may be formed in any suitable way. An example of a suitable manufacturing techniques is a molding operation. In some embodiments, RF connector module 210 may be formed using a multi-shot molding operation, such as a two shot molding operation. In a first shot, insulative housing 220 may be insert molded around the lead frame. The mold used for the first shot may have features providing openings for lossy regions 240A, 240B ... 240E. For the second shot, these features may be removed, and voids left by removing those features may be filled with lossy material, creating a lossy region that extends above the surface of insulative housing 220. Though, any suitable manufacturing technique may be used.

FIGS. 2A and 2B illustrate opposing sides of RF connector module 210. As can be seen in these views, lossy regions 240A, 240B ... 240E extend through insulative housing 220. Both shield members 230A and 230B are mechanically attached to lossy regions 240A, 240B ... 240E. In this way, the shield members may be electrically coupled through the lossy regions.

Any suitable lossy material may be used to form lossy regions 240A, 240B ... 240E. Materials that conduct, but with some loss, over the frequency range of interest are referred to herein generally as "lossy" materials. Electrically lossy materials can be formed from lossy dielectric and/or lossy conductive materials. The frequency range of interest depends on the operating parameters of the system in which such a connector is used, such as up to 25 GHz, though higher frequencies or lower frequencies may be of interest in some applications. Some connector designs may have frequency ranges of interest that span only a portion of this range, such as 1 to 10 GHz or 3 to 15 GHz or 3 to 6 GHz.

Electrically lossy material can be formed from material traditionally regarded as dielectric materials, such as those that have an electric loss tangent greater than approximately 0.003 in the frequency range of interest. The "electric loss tangent" is the ratio of the imaginary part to the real part of the complex electrical permittivity of the material. Electrically lossy materials can also be formed from materials that are generally thought of as conductors, but are either relatively poor conductors over the frequency range of interest, contain particles or regions that are sufficiently dispersed that they do not provide high conductivity or otherwise are prepared with properties that lead to a relatively weak bulk conductivity over the frequency range of interest. Electrically lossy materials typically have a conductivity of about 1 siemens/meter to about $6.1 \times 10^7$ siemens/meter, preferably about 1 siemens/meter to about $1 \times 10^7$ siemens/meter and most preferably about 1 siemens/meter to about 30,000 siemens/meter. In some embodiments material with a bulk conductivity of between about 10 siemens/meter and about 100 siemens/meter may be used. As a specific example, material with a conductivity of about 50 siemens/meter may be used. Though, it should be appreciated that the conductivity of the material may be selected empirically or through electrical simulation using known simulation tools to determine a suitable conductivity that provides both a suitably low cross talk with a suitably low insertion loss.

Electrically lossy materials may be partially conductive materials, such as those that have a surface resistivity between 1 Ω/square and 106 Ω/square. In some embodiments, the electrically lossy material has a surface resistivity between 1 Ω/square and $10^3$ Ω/square. In some embodiments, the electrically lossy material has a surface resistivity between 10Ω/square and 100 Ω/square. As a specific example, the material may have a surface resistivity of between about 20 Ω/square and 40 Ω/square.

In some embodiments, electrically lossy material is formed by adding to a binder a filler that contains conductive particles. Examples of conductive particles that may be used as a filler to form an electrically lossy material include carbon or graphite formed as fibers, flakes or other particles. Metal in the form of powder, flakes, fibers or other particles may also be used to provide suitable electrically lossy properties. Alternatively, combinations of fillers may be used. For example, metal plated carbon particles may be used. Silver and nickel are suitable metal plating for fibers. Coated particles may be used alone or in combination with other fillers, such as carbon flake. The binder or matrix may be any material that will set, cure or can otherwise be used to position the filler material. In some embodiments, the binder may be a thermoplastic material such as is traditionally used in the manufacture of electrical connectors to facilitate the molding of the electrically lossy material into the desired shapes and locations as part of the manufacture of the electrical connector. Examples of such materials include LCP and nylon. However, many alternative forms of binder materials may be used. Curable materials, such as epoxies, can serve as a binder. Alternatively, materials such as thermosetting resins or adhesives may be used. Also, while the above described binder materials may be used to create an electrically lossy material by forming a binder around conducting particle fillers, the invention is not so limited. For example, conducting particles may be impregnated into a formed matrix material or may be coated onto a formed matrix material, such as by applying a conductive coating to a plastic housing. As used herein, the term "binder" encompasses a material that encapsulates the filler, is impregnated with the filler or otherwise serves as a substrate to hold the filler.

Preferably, the fillers will be present in a sufficient volume percentage to allow conducting paths to be created from particle to particle. For example, when metal fiber is used, the fiber may be present in about 3% to 40% by volume. The amount of filler may impact the conducting properties of the material.

Filled materials may be purchased commercially, such as materials sold under the trade name Celestran® by Ticona. A lossy material, such as lossy conductive carbon filled adhesive preform, such as those sold by Techfilm of Billerica, Mass., US may also be used. This preform can include an epoxy binder filled with carbon particles. The binder surrounds carbon particles, which acts as a reinforcement for the preform. Such a preform may be inserted in a wafer to form all or part of the housing. In some embodiments, the preform may adhere through the adhesive in the preform, which may be cured in a heat treating process. In some embodiments, the adhesive in the preform alternatively or additionally may be used to secure one or more conductive elements, such as foil strips, to the lossy material.

Various forms of reinforcing fiber, in woven or non-woven form, coated or non-coated may be used. Non-woven carbon fiber is one suitable material. Other suitable materials, such as custom blends as sold by RTP Company, can be employed, as the present invention is not limited in this respect.

As shown in FIGS. 2A and 2B, right angle RF connector module 210 mates with backplane RF connector module 250. In the embodiment illustrated, backplane RF connector module 250 includes a shroud 260. Shroud 260 may be made of an insulative material, and may be made of the same insulative material as housing 220. Shroud 260 may be made in a molding operation, though any suitable construction technique may be used. For example, in alternative embodiments, some or all of shroud 260 may be made of conductive or partially conductive material, including powdered metals. Though, if shroud 260 is conductive or partially conductive, signal conductors passing through shroud 260 may be held in insulative material that separates the signal conductors from shroud 260.

Mounted within shroud 260 are shield members 270A and 270B. Shield member 270A is visible in FIG. 2A, showing the left side of backplane RF connector module 250. Shield member 270 B is visible in FIG. 2B, showing the right side of backplane RF connector module 250.

In the embodiment illustrated, shield members 270A and 270B are planar conductive members. These members may be stamped from a sheet of metal or formed in any other suitable way from conductive material. Each of the shield members 270A and 270B may contain contacts 272 adapted to make electrical contact with portions of shield members 230A and 230B, respectively. The contacts may have any suitable shape. In this example, the contacts 272 each contain a compliant portion which, when right angle RF connector module 210 is mated with backplane RF connector module 250, press against a respective shield member 230A or 230B. In this specific example of FIGS. 2A and 2B, each of the shield members 270A and 270B has three contacts 272. Each of the contacts 272 is of the same shape. This shape is illustrated to provide a torsional beam type contact.

Each of the shield members 230A and 230B may have one or more contact tails 274, adapted for making electrical contact with a printed circuit board, such as backplane 160 (FIG. 1). In this example, the contact tails are compliant, eye of the needle contact tails, which may be used for a press fit attachment of backplane RF connector module 250 to a printed circuit board. Though, any suitable type of contact tail may be used.

Shield members 230A and 230B may be attached to shroud 260 in any suitable way. Each shield member, for example, may be inserted in slots in opposing sidewalls of shroud 260. The contact tails may pass through openings a floor of shroud 260.

Other shield members may alternatively or additionally be inserted into shroud 260. FIGS. 2A and 2B show shield members 264. As with other shield members, shield members 264 may be stamped of metal or otherwise formed in whole or in part of a conductive material. In this example, shield members 264 are perpendicular to shield members 270A and 270B and also may be inserted into slots, such as slot 262, in the floor of shroud 260.

Shield members 264 may be electrically coupled to shield members 270A and 270B. In the example of FIGS. 2A and 2B, each of the shield members 264 is electrically coupled to both shield members 270A and 270B. This coupling may be provided in any suitable way, including by providing openings in shield members 270A and 270B sized to receive shield members 264, but with a tight enough fit that electrical contact is made.

Shield members 270A and 270B alternatively or additionally may be shaped to make contact with shield members 264 when right angle RF connector module 210 is mated with backplane RF connector module 250. Each of the shield members 270A and 270B may contain slots (364, FIG. 3A) that are positioned to align with shield members 264. Such a configuration serves to tie together the forward edges of shield members 270A and 270B.

Though not visible in FIGS. 2A and 2B, backplane RF connector module 250 may contain conductive elements. These conductive elements may be shaped to provide signal conductors and ground conductors. The signal conductors and ground conductors of backplane RF connector module 250 may align with corresponding signal and ground conductors of right angle RF connector module 210. These signal conductors also may be formed in any suitable way, including by stamping from a sheet of metal. The signal and ground conductors may then be inserted into openings in the floor of shroud 260.

FIGS. 3A and 3B show in further detail right angle RF connector module 210. Here, right angle RF connector module 210 is illustrated without backplane RF connector module 250. In this configuration, two portions of shield member 230A are visible. Portion 310A rests against a surface of insulative housing 220 (FIG. 2A). Portion 312A extends beyond the insulative housing. Portion 312A extends into the mating interface area of RF connector module 210.

In the embodiment illustrated, portions 310A and 312A of shield member 230A are formed from a unitary sheet of metal. Though shield member 230A is a generally planar shield member, a transition 314A may be included between portions 310A and 312A. Transition 314A allows the spacing between different portions of shield members 230A and 230B to be different. In this example, transition 314A brings the portions 312A and 312B closer together at the mating interface area than over portions of insulative housing 220.

In operation, portion 312A mates with shield member 270A of backplane RF connector module 250 when the connector modules are mated. Slots 364 are visible in the forward mating edge of portion 312A. Slots 364 may engage shield members 264 when the connector modules are mated.

Shield member 230B may similarly have two portions. Portion 312B, like portion 312A, extends beyond insulative housing 220 into a mating interface area. Though not visible in FIGS. 3A and 3B, shield member 230B may also include a portion adjacent insulative housing 220.

FIG. 3B reveals additional details of the mating interface portion of RF connector module 210. A column 350 of conductive elements extends from insulative housing 220 to form the mating interface area. The extending portions may form mating contacts for RF connector module 210. The mating contacts, in the embodiment illustrated, are positioned between portions 312A and 312B of shield members 230A and 230B, respectively.

The mating contact portions may have any suitable size and shape. In an embodiment as illustrated in which each RF connector module 210 is configured to carry two RF signals, two of the mating contacts in column 350 may be the mating contact portions of RF signal conductors within RF connector module 210. Others of the mating contacts in column 350 may be the mating contact portions of ground conductors. In this example, mating contacts 324A and 324B may the mating contacts for RF signal conductors. The remaining mating contacts, of which mating contacts 322A, 322B, 322D and 322E are numbered, may be mating contacts for ground conductors.

Though the RF connector module 210 may be designed such that the primary mode of propagation of an RF signal is within a coplanar waveguide created within a lead frame embedded within insulative housing 220, some energy may have the tendency to propagate in other modes, which could create interference between RF signals in an interconnection system. In the embodiment illustrated, shield members 230A and 230B are parallel to column 350. In this configuration, the shield members may block RF radiation from an RF signal conductor in one RF connector module 210 from causing interference with an RF signal on an RF signal conductor in another nearby RF connector module.

Additionally, one or more features may be included in RF connector module 210 to reduce interference between RF signal conductors within column 350. These features additionally may decrease the amount of radiation propagating from one RF connector module to another. For example, shield members 230A and 230B also may reduce interference along the column 350. As illustrated in FIGS. 2A and 2B, in operation, the mating edges of shield members 230A and 230B may be coupled to ground through contacts 272, which may reduce the amount of RF signal energy that propagates in a direction along the column 350 or that radiates from shield members 230A and 230B to create interference in other RF connector modules.

Alternatively or additionally, the shield members 230A and 230B may be electrically connected together through shield members 264 of backplane RF connector module 250. Such a configuration may also reduce the amount of RF signal energy that propagates along column 350 or that radiates from a shield members 230A and 230B. Alternatively or additionally, inclusion of lossy regions, such as lossy regions 240A . . . 240E (FIG. 2A) may reduce the amount of RF signal energy that propagates along column 350 or that radiates from shield members 230A and 230B. Electromagnetic energy near shield members 230A and 230B may be at least partially dissipated by the lossy regions connecting those shield members.

FIG. 3B illustrates yet a further feature that may be included within RF connector module 210 to reduce the amount of RF signal energy that propagates along column 350. In the embodiment illustrated, tabs 370A and 370B extend from portions 312A and 312B, respectively. Tabs 370A and 370B may be electrically connected to other portions of shield members 230A and 230B such that those portions may also be coupled to ground and to lossy material within RF connector module 210.

Each of tabs 370A and 370B may be positioned along column 350 two fall between two RF signal conductors. In the embodiment illustrated, tabs 370A and 370B are approximately halfway between mating contact portions 324A and 324B of the RF signal conductors in RF connector module 210. Alternatively or additionally, tabs 370A and 370B may be positioned to align with mating contact portions of ground conductors. In this example, tabs 370A and 370B extend perpendicular to column 350 at a location aligned with mating contact 322C of a ground conductor within RF connector module 210.

Tabs 370A and 370B may be manufactured in any suitable way. In some embodiments, tabs 370A and 370B may be integrally formed with portions 312A and 312B. For example, an opening, such as opening 372A in portion 370A, may be stamped in the same sheet of metal used to form a shield member. The material from the opening may be bent to be perpendicular to the plane of the shield member. Though, any suitable construction techniques may be used to form tabs 370A and 370B.

Turning to FIGS. 4A and 4B, further details of backplane RF connector module 250 are illustrated. FIGS. 4A and 4B reveal shroud 260, shield members 270A and 270B, as well as shield members 264. Additionally, conductive elements within shroud 260 are visible. A column 450 of conductive elements is positioned between shield members 270A and 270B. Column 450 is positioned such that the conductive elements in column 450 will mate with the conductive elements in column 350 when a right angle RF connector module 210 is mated with a backplane RF connector module 250.

In FIGS. 4A and 4B, signal conductors 424A and 424B and ground conductors 422B and 422C of column 450 are numbered. These conductive elements may be of any suitable shape. In this example, signal conductors 424A and 424B have the same shape, which is a different shape than ground conductors 422B and 422C.

The elements of backplane RF connector module 250 may be formed and assembled in any suitable way, including using materials and techniques as are known in the art in the manufacture of high-speed data connectors. For example, shroud 260 may be molded of an insulative material, which may be the same material used to form housing 220 (FIG. 2A). Though, in some embodiments, portions of shroud 260 may be formed of a lossy material. In yet other embodiments, shroud 260 may be formed of metal or other conductive material. In those embodiments, insulated spacers may be used to separate signal conductors 424A and 424B from shroud 260.

Shroud 260 may be formed with features that facilitate attachment of other elements that form backplane RF connector module 250. As shown, shroud 260 may be formed with a floor 412 and sidewalls 414. Floor 412 may have openings and/or slots adapted to receive conductive elements. For example, floor 412 may be molded with slots, each of which has a shape to receive a shield member 264. As shown, there are multiple shield members 264. Accordingly, there may be multiple such slots in floor 412.

Sidewalls 414 may have features to which other elements of RF backplane connector module 250 are attached. For example, channels 410 are shown in sidewalls 414. Each of the channels 410 receives one end of a shield member 270A or 270B.

Some or all of the conductive elements within backplane RF connector module 250 may be attached to a printed circuit board, such as backplane 160, or other substrate to which connector module 250 is attached. Such connections may be made through contact tails 274 extending through a lower surface of floor 412. Contact tails extending from shield members 270A or 270B, for example, may extend through floor 412. Similarly, some or all of the conductive elements in column 450 may have contact tails extending through floor 412.

Though not included in the illustrated embodiment, shield members 264 also may have contact tails. Rather, in the illustrated embodiment, shields 264 are coupled indirectly to a printed circuit board. In this specific example, shield members 264 are connected to shield members 270A and 270B. Additionally, shield members 264 are connected to ground conductors, such as ground conductors 422B or 422C.

Turning to FIG. 5, further details of the construction of right angle RF connector module 210 are provided. FIG. 5 shows connector module 210 with insulative housing 220 cut away. In this view, shield members 230A and 230B are visible. Between shield members 230A and 230B, lead frame 530 is positioned. In this example, lead frame 530 is equidistant from shields 230A and 230B.

From this perspective, lossy regions, of which lossy regions 240B and 240E are numbered, are visible. In this configuration, the lossy regions extend from one surface to an opposing surface of right angle RF connector module 210. Those lossy regions extend through the surfaces such that a projecting portion, of which projecting portion 542E of lossy region 240E is numbered. These projecting portions may be used to form an electrical connection between the lossy regions and shield members 230 A and 230B on the exterior of module 210. The projecting portions also may be used for mechanical attachment of the shield members 230A and 230B to those surfaces.

In this example, an interference fit between shield member 230A and projecting portion 542E is used to mechanically attach shield member 230A to RF connector module 210. That interference fit may be created using a hole in shield member 230A. In this specific example, a hole is formed with a slightly conical rim 540E. To attach shield member 230A, the shield member may be pressed against the surface of module 210, forcing projecting portion 542E through the hole. In this example, the periphery of the hole defined by rim 540E is slightly smaller than the periphery of projecting portion 542E. Because, in the embodiment illustrated, lossy region 240E is formed from a material having a plastic binder, projecting portion 542E will deform sufficiently to pass through the hole. The conical shape of rim 540E allows shield member 230A to move relatively easily toward the insulative housing of connector module 210, but will dig into projecting portion 542E, preventing shield member 230A from being moved away from the insulative housing.

The same form of attachment may be used for each of the lossy regions 240A . . . 240E, providing both electrical and mechanical connections across each of the shield members 230A and 230B. A similar form of attachment may be used to hold shield member 230B to an opposing side of right angle RF connector module 210.

FIG. 5 also reveals a signal launch region 510B where an RF signal may pass between right angle RF connector module 210 and a printed circuit board to which connector module 210 is attached. That signal launch region includes contact tails from lead frame 530 and contact tails extending from shield members 230A and 230B. Here, signal launch region 510B includes contact tail 224B, extending from an RF signal conductor in lead frame 530. Contact tails 222F and 222G extending from ground conductors in lead frame 530 may also be included in signal launch region 510B. Further, contact tails extending from shield members 230A and 230B may also be included. The contact tails extending from the ground conductors and shield members 230A and 230B may be connected together in the printed circuit board, such as by a common ground plane.

In this way, contact tail 224B of the RF signal conductor may be surrounded, in a generally circular pattern, by contact tails attached to ground. The diameter of this circle may be selected to provide a desired impedance for the signal launch region. The diameter may be controlled by adjusting parameters, including: spacing of the contact tails within lead frame 530; spacing of the contact tails on shield members 230A and 230B; and the separation between contact tail 224B of the RF signal conductor and portions 530A and 530B of shield members 230A and 230B. In the illustrated embodiment, portions 530A and 530B are formed as extensions from portions 310A and 310B of shield members 230A and 230B. Accordingly, the separation between portions 310A and 310B may be different than the separation between portions 310A and 310B. In this example, transitions between portions 310A and 310B and portions 530A and 530B, respectively, position portions 530A and 530B closer together than portions 310A and 310B.

A similar signal launch region may be formed around other signal conductors within RF connector module 210. A signal launch region 510A is shown around another RF signal conductor in module 210. In modules containing more than two signal conductors, additional signal launch regions may be present.

Turning to FIG. 6, additional details of backplane RF connector module 250 are shown. FIG. 6 illustrates backplane RF connector module 250 with shroud 260 cut away. In this view, shield members 270A and 270B as well as shield members 264 are visible. Each of the shield members 264 is coupled near each end to one of the shield members 270A and 270B, electrically connecting shield members 270A and 270B at multiple locations. Conductive elements in column 450 are also visible. Ground conductors 422A, 422B and 422C are shown.

In this embodiment, column 450 also contains two RF signal conductors 424A and 424B. These conductive elements are configured such that each of the RF signal conductors 424A and 424B is positioned between, and is adjacent to, two ground conductors. For example, RF signal conductor 424A is positioned between adjacent ground conductors 422A and 422B. RF signal conductor 424B is positioned between adjacent ground conductors 422B and 422C. In this way, a coplanar waveguide is formed around each of the signal conductors within backplane connector module 250.

Column 450 is here positioned equidistant from shield members 270A and 270B. Though, equidistant spacing from the shield members is not a requirement. In some embodiments, column 450 may be positioned closer to one of shield members 270A and 270B than the other. The spacing to the nearer shield member may be selected to provide a desired impedance to RF signal conductors 424A and 424B. Positioning RF signal conductors 424A and 424B closer to a shield member, for example, may decrease the impedance of the signal conductor. Though, the same effect on impedance may be achieved by reducing the spacing between shield members 270A and 270B. However, in the embodiment illustrated, column 450 is separated from shield members 270A and 270B by a sufficient distance that the impedance of the RF signal conductors is determined primarily by the spacing between the RF signal conductors 424A and 424B and adjacent ground conductors 422A, 422B and 422C of the coplanar waveguides.

FIG. 7 shows further detail of an RF connector assembly. In FIG. 7, lead frame 530 of right angle RF connector module 210 is shown mated with the conductive elements of column 450 of backplane RF connector module 250. In this example in which two RF signal conductors are included within the connector modules, two narrow conductive elements 724A and 724B act as RF signal conductors. Each of the conductive elements 724A and 724B is adjacent, on two sides, to wider conductive elements 722A, 722B or 722C. In operation, conductive elements 722A, 722B or 722C may act as ground conductors by virtue of connection to a conductive structure connected to a ground in the interconnection system.

The dimensions of lead frame 530 may be selected to provide a desired impedance. Though, as noted above, other parameters, such as spacing relative to shields 230A and 230B may, in some embodiments, influence impedance. The width of conductive elements 724A and 724B as well as the edge to edge spacing to adjacent conductive elements 722A, 722B or 722C may be selected to provide a desired impedance. For RF connectors, the selected impedance may be 50 Ohms or 75 Ohms to match the impedance of conventional coaxial connectors. However, there is no requirement that these conventional impedance values be met. To the contrary, the construction for an RF connector illustrated in FIG. 7 may be readily adapted to any desired impedance by changing the lead frame 530 and the corresponding column 450 of conductive elements in the backplane connector module. As a result, a connector manufacturer may economically provide a line of RF connector products with impedance values tailored for specific applications.

FIG. 7 reveals additional details of the construction that may be included in lead frame 530. In this example, conductive elements 722A, 722B or 722C each contains one or more openings 740A, 740B . . . 740E. These openings allow lossy regions 240A, 240B . . . 240E to pass through conductive elements 722A, 722B or 722C. Openings 740A, 740B . . . 740E support manufacture of right angle RF connector module 210 using insert molding techniques. For example, during a second shot molding operation, molten lossy material may be inserted into openings in housing 220 that align with openings 740A, 740B . . . 740E. In this way, lossy regions extending from one surface of insulative housing 220 to an opposing surface may be simply formed. Once formed in this way, the lossy regions will be in contact with conductive elements 722A, 722B and 722C, providing a lossy coupling between the conductive elements that form the ground system of right angle RF connector module 210. In the example illustrated in which the lossy regions are used for attaching external shield members 230A and 230B, this construction technique provides lossy coupling between external shield members 230A and 230B and the conductive elements 722A, 722B and 722C forming the ground portions of coplanar waveguides internal to connector module 210.

FIG. 7 also reveals details of an exemplary mating interface between a right angle RF connector module 210 and a backplane RF connector module 260. In this example, the mating interface uses a beam on pad configuration. The conductive elements of lead frame 530 each terminate in one or more beams, forming at least a portion of the mating contact for the conductive element. Conductive element 722A has, at a distal end, mating contact 322A. Conductive element 722B, in this example, has three mating contacts 322B, 322C and 322 D. Conductive element 722C has meeting contacts 322E and 322F. In this example, each of the mating contacts for the conductive elements acting as ground conductors is shaped as a beam. The dimensions of the beam may be selected to provide a desired contact force, and may be selected as in a high-speed data connector design or in any other suitable way.

The conductive elements in column 450 have mating contact portions that are generally planar. The planar configuration of the mating contacts of column 450 provides pads against which the beams of the conductive elements in lead frame 530 may press for mating. In the mated configuration illustrated in FIG. 7, mating contact 322A presses against a planar portion of conductive element 422A. Mating contacts 322B, 322C and 322D, associated with conductive element 722B, press against a planar portion of mating contact 422B. Similarly, mating contacts 322E and 322F press against a planar portion of conductive element 422C.

The mating contacts of the signal conductors in right angle RF connector module 210 similarly may be shaped to form beams similar to those formed on the ground conductors. Though, in some embodiments, the signal conductors may have mating contacts shaped differently than those for the ground conductors. In some embodiments, either or both of the mating contacts in right angle RF connector module 210 and/or backplane RF connector module 250 may include at least two portions shaped and positioned to engage a corresponding conductive element from the meeting connector module at least two locations. In some embodiments, the two portions of a mating contact may be configured to press against opposing sides of the corresponding conductive element In the embodiments illustrated in FIGS. 6 and 7, for example, the mating contacts for each of the signal conductors may contain both a beam portion and a planar portion. Such a configuration of signal conductors 424A and 424B is visible in FIG. 6, with a beam 820 and a planar portion 822. Such a configuration may improve the integrity of signals passing through the RF connector modules. FIGS. 8A, 8B and 8C illustrate how such a configuration for a mating contact improves signal integrity.

FIG. 8A shows a mating contact formed as a single beam 810 engaging a mating contact formed with a planar portion 812. Single beam 810, for example, may represent a mating contact of a signal conductor within right angle RF connector module 210. Planar portion 812 may represent a mating contact of a signal conductor in a backplane RF connector module 250. FIG. 8A illustrates that beam 810 makes contact with planar portion 812 a distance $S_1$ from the distal end of planar portion 812. This distance $S_1$ creates an un-terminated, conductive member attached to a signal path through the mating contacts illustrated in FIG. 8A. Such a conductive member is sometimes referred to as a "stub".

A stub can, under some conditions, cause signal reflections or other distortions of a signal passing through the mating contacts, degrading signal integrity. Specifically, a stub may cause significant interference when the length $S_1$ is an appreciable fraction of the wavelength of signals propagating through the mating contacts. As the frequency of the signal increases, the wavelength decreases such that for an RF signal, which has a relatively high frequency, what might appear as a relatively short stub may cause significant signal disruptions.

FIG. 8B illustrates a side view of a mating contact formed with a planar portion 822 and a beam 820. Planar portion 822 and beam 820 are, in the configuration illustrated in FIG. 8B, positioned side-by-side with their longitudinal axes in parallel. In the view illustrated, a cross-section is taken through planar portion 822, which is in front of beam 820.

The mating contact illustrated in FIG. 8B is an example of a mating contact that can provide multiple points of contact that are distributed longitudinally along an axis of the conductive elements. When mated with a mating contact from a corresponding connector, one point of contact can be formed on planar portion 822 and a second point of contact can be formed on beam 820. The mating contact from the corresponding connector may be shaped such that these points of contacts are offset in a direction along the length of planar portion 822 and beam 820. In this configuration, multiple points of contact can reduce the length of a stub formed at the distal ends of the mating contacts.

FIG. 8C illustrates how multiple points of contact reduces the length of a stub. In the embodiment illustrated in FIG. 8C, the mating contact with the corresponding connector has the same shape as the mating contact illustrated in FIG. 8B. However, the orientation of the mating contact is reversed. FIG. 8B shows a beam 820A and a planar portion 822A that form the mating contact of a conductive element of a connector, such as right angle RF connector module 210. A second beam 820B and a second planar portion 822B form the mating contact of a conductive element in a corresponding connector, such as backplane RF connector module 250. In the configuration illustrated in FIG. 8C, planar portion 822A is in front of beam 828A, but beam 820B is in front of planar portion 822B.

With this configuration multiple points of contact along the length of the meeting contact portion has the effect of reducing the stub length to $S_2$, which more closely approximates the distance between the point of contact for a beam 820A or 820B and the end of the beam.

Though, it should be appreciated that mating contacts of other shapes may alternatively or additionally be used to reduce the length of a stub formed when a mating contact engages a mating contact from a corresponding connector.

FIGS. 8A, 8B and 8C represents mating contacts on signal conductors. Similar mating contacts may be used on ground conductors. However, in the embodiments illustrated in FIG. 7, the mating contacts for ground conductors are different than those used for the signal conductors. In FIG. 7, ground conductors within lead frame 530 have mating contacts that are shaped as single beams (though some of the conductive elements include multiple single beam meeting contacts).

Figure 9B:
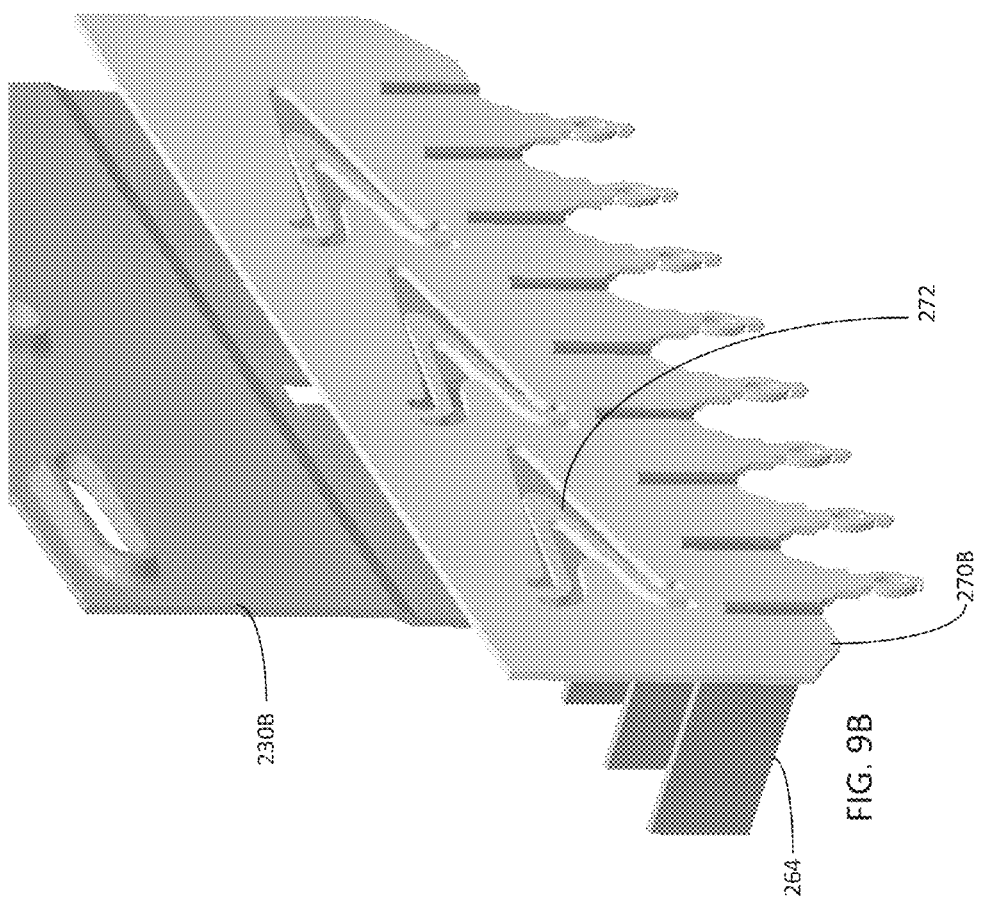
FIG. 9B is an enlarged view, viewed from the right side, of the right side shield members of FIG. 9A.
Figure 9A:
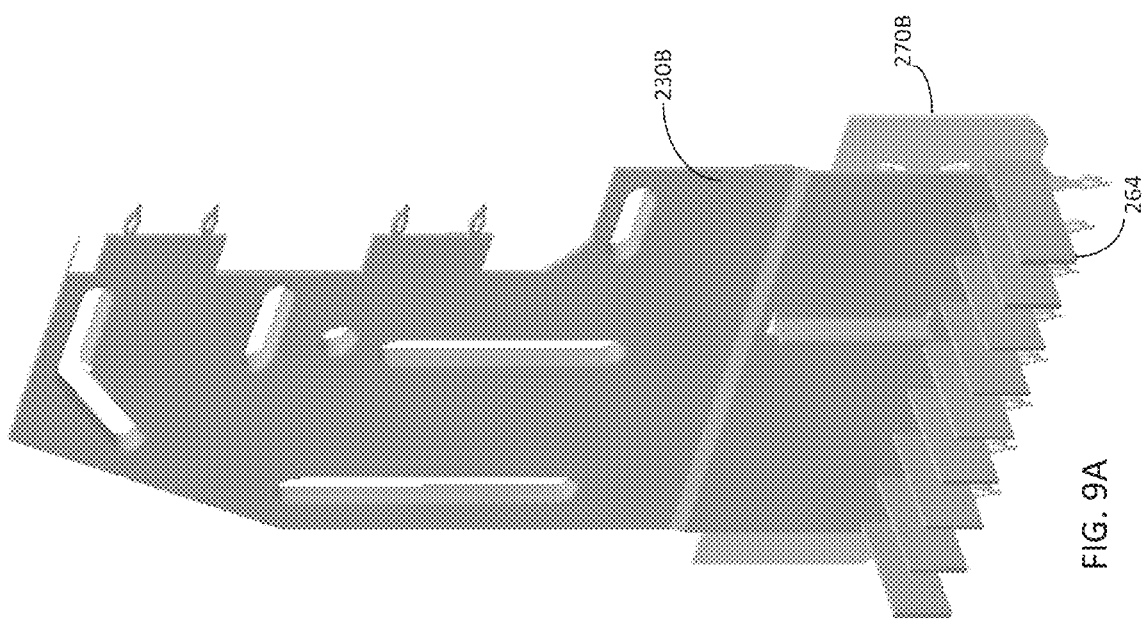
FIG. 9A is a view, from the left side, of a right side shield member of the RF connector module of FIGS. 2A and 2B engaging a shield member of the corresponding backplane RF connector module of FIGS. 2A and 2B.

Other types of mating contacts may be used for shield members in some embodiments. FIGS. 9A and 9B illustrate additional details of the mating of external shield members. For simplicity, FIGS. 9A and 9B illustrate an external shield member 230B from a right angle RF connector module 210 engaging a shield number 270B and shield members 264 from a backplane RF connector module 250.

Slots, such as slots 364 (FIG. 3A) in shield member 230B engage shield members 264. The engagement between shield number 230B and shield members 264 may be formed in any suitable way. In some embodiments, shield member 230B may be stamped with compliant portions forming the sidewalls of slots 364 such that a tight fit may be formed between shield member 230B and each of the shield members 264. Though, in other embodiments, other coupling mechanisms alternatively or additionally may be used. For example, slots 364 may be sized to be slightly narrower than the width of shield members 264 such that an interference fit is formed between each slot 364 and a shield member 264. In yet other embodiments, slots 364 may be sized to be slightly wider than the width of shield members 264. This configuration may reduce the insertion force for mating of right angle RF connector module 210 and backplane RF connector module 250, but may provide less reliable contact. However, for some embodiments, other points of contact tying together conductive elements that are grounded may provide sufficient coupling between the ground conductors of the connector modules.

As shown in FIGS. 9A and 9B, shield members 264 are electrically coupled to shield members, of which shield member 270B is illustrated, in backplane RF connector module 250. Those shield members are in turn coupled to the external shield members in the right angle RF connector module 210. Coupling between shield member 230B and shield member 270B is provided through contacts 272.

A connection between shield members 264 and shield member 270B may be provided in any suitable way. As shown, each of the shield members 264 is inserted into a slot with in shield member 270B. The slot may have walls shaped to provide compliant portions that are deformed, and therefore generate contact force, when shield members 264 are inserted in the slots. Alternatively, coupling between shield members 264 and shield number 270B may be formed as a result of an interference fit or loose placement of the shield members in the slots, or in any other suitable way.

Contacts 272 may have any suitable configuration. However, in the embodiment illustrated, contacts 272 are torsional contacts. Such a contact is formed by stamping a beam from the same sheet of metal used to form shield member 270B. The beam may remain attached at both ends to the body of shield number 270B. That beam may be twisted out of the plane of shield member 270B. In the configuration shown in FIG. 9B, beams 272 are twisted out of the plane of shield number 270B towards shield 230B. Upon the mating between connector modules 210 and 250, shield member 230B will press against beam 272, generating a torsional spring force in beam 272, which provides a contact force.

Figure 10:
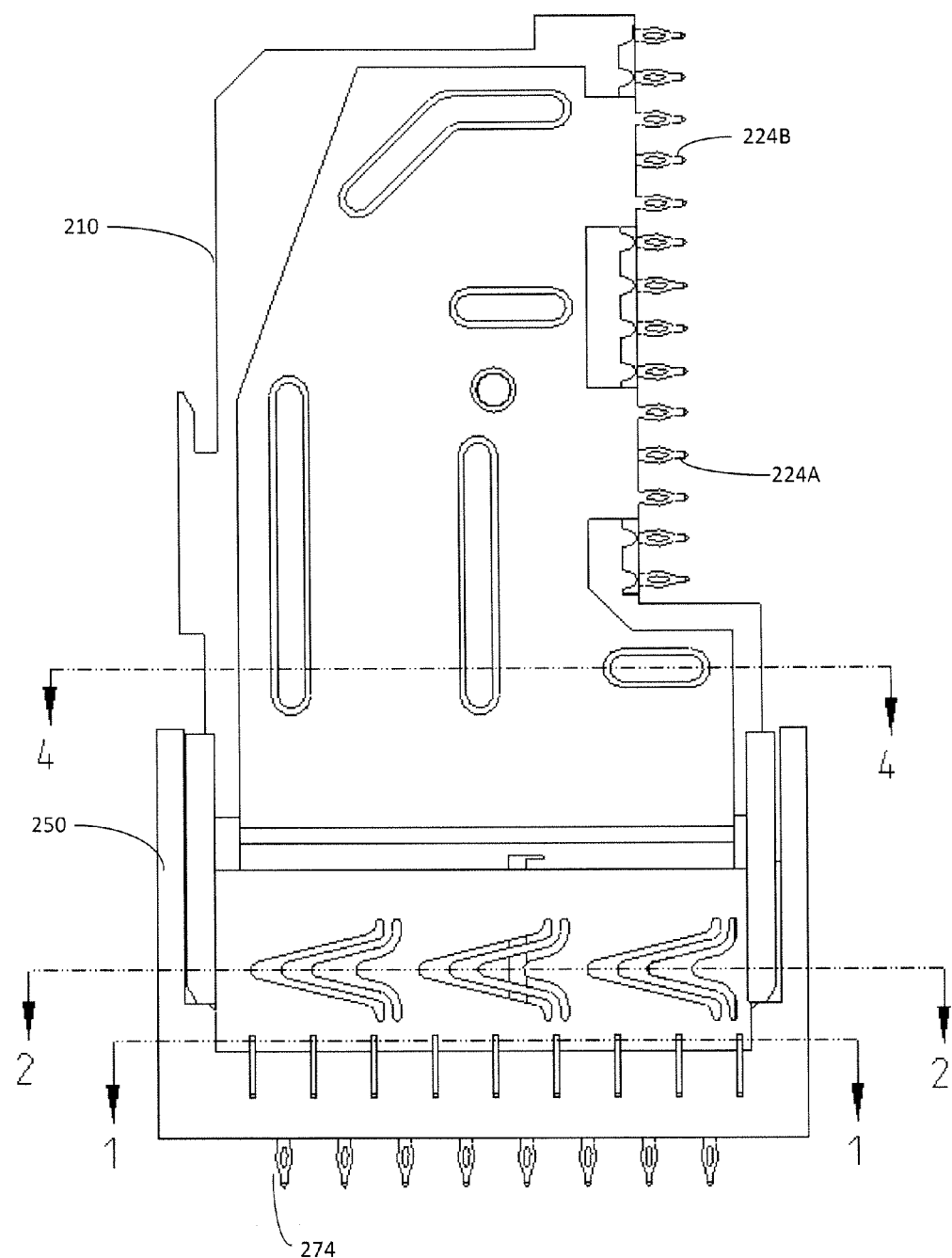
FIG. 10 is a plan view of the left side of the right angle RF connector module and the corresponding connector module of FIGS. 2A and 2B.

Regardless of the specific coupling mechanisms, the connector modules, when mated, though cantilever beam shaped contacts or contacts of any suitable shape may be used, provide RF signal paths in which the electrical properties are dominated by a coplanar waveguide structure. FIG. 10 illustrates, in plan view, the right angle RF connector module 210 mated with backplane RF connector module 250. In this figure, contact tails, of which contact tails 274 and 224A and 224B are numbered, are shown. Such contact tails may be used to attach, electrically and mechanically, the connector modules to printed circuit boards in an interconnection system. Though, for simplicity of illustration, the printed circuit boards are not shown in FIG. 10.

The coplanar waveguide structure can be seen in cross sections through the mated connector modules. FIG. 10 illustrates cross sections 4-4 through the intermediate portions of the conductive elements within right angle RF connector module 210. Cross section 2-2 passes through the mating interface of the connector modules. Cross section 1-1 passes through the mated connector modules near the floor of backplane RF connector module 250.

Figure 11:
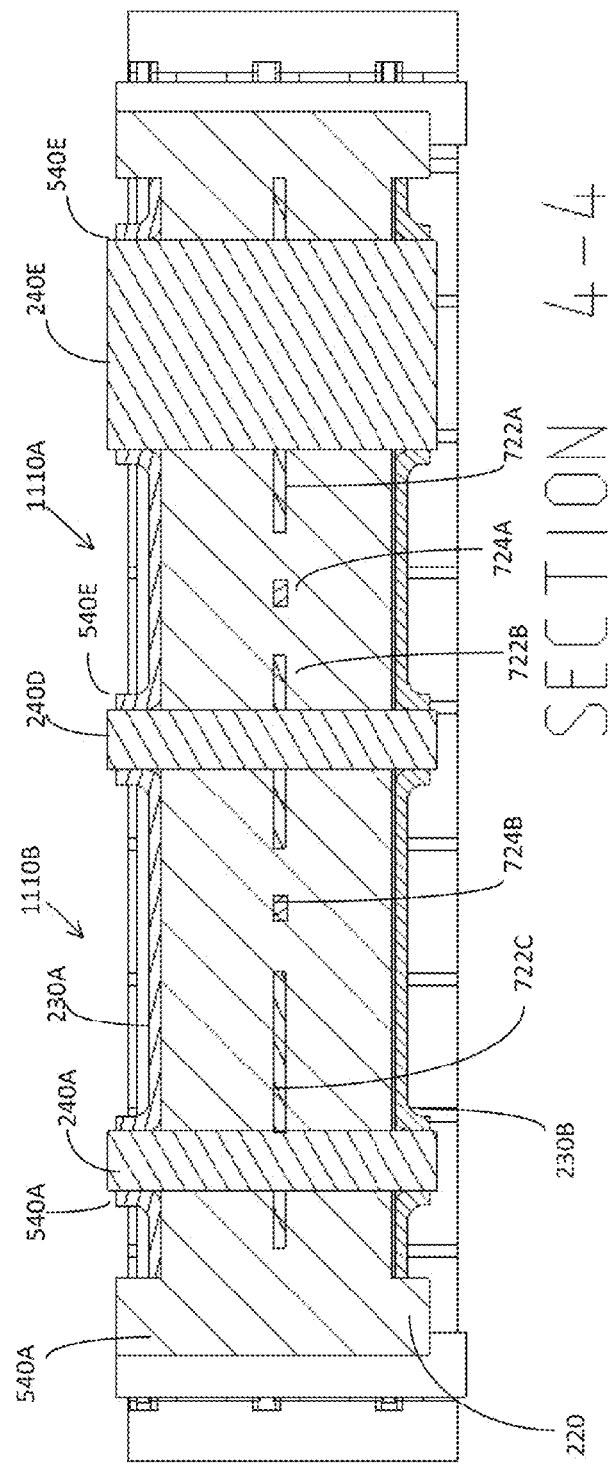
FIG. 11 is a cross-sectional view along the line 4-4 in FIG. 10.

FIG. 11 shows cross-section 4-4. In this view, two coplanar waveguides are visible. Coplanar waveguide 1110A is formed around conductor element 724A. Coplanar waveguide 1110B is formed around conductive element 724B. In coplanar waveguide 1110A, signals predominately propagate around conductive element 724A, concentrated between conductive element 724A and adjacent conductive elements 722A and 722B. In coplanar waveguide 1110B, signals predominately propagate around conductive element 724B, concentrated between conductive element 724B and adjacent conductive elements 722B and 722C.

Shield members 230A and 230B prevent radiation from external sources from interfering with propagation of RF signals along conductive elements 724A and 724B. Those shield members also prevent radiation from either of conductive elements 724A or 724B from propagating to an adjacent conductive element.

Lossy regions, of which lossy regions 240A, 240 D and 240E are illustrated in the cross-section of FIG. 11, also shape the electromagnetic fields around conductive elements 724A and 724B to reduce interference between each of the conductive elements carrying a signal and adjacent signal conductors. Lossy regions 240D, for example, may damp any electromagnetic signal that might otherwise tend to propagate across conductive element 722B.

Lossy region 240D, as well as other lossy regions such as lossy regions 240A and 240E, provide lossy coupling between shield members 230A and 230B. Rims 540A, 540D and 540E around openings in shield member 230A are shown engaging lossy regions 240A, 240D and 240E, respectively. Similar rims (not numbered) around openings in shield member 230B join shield 230B to the lossy regions.

Figure 12:
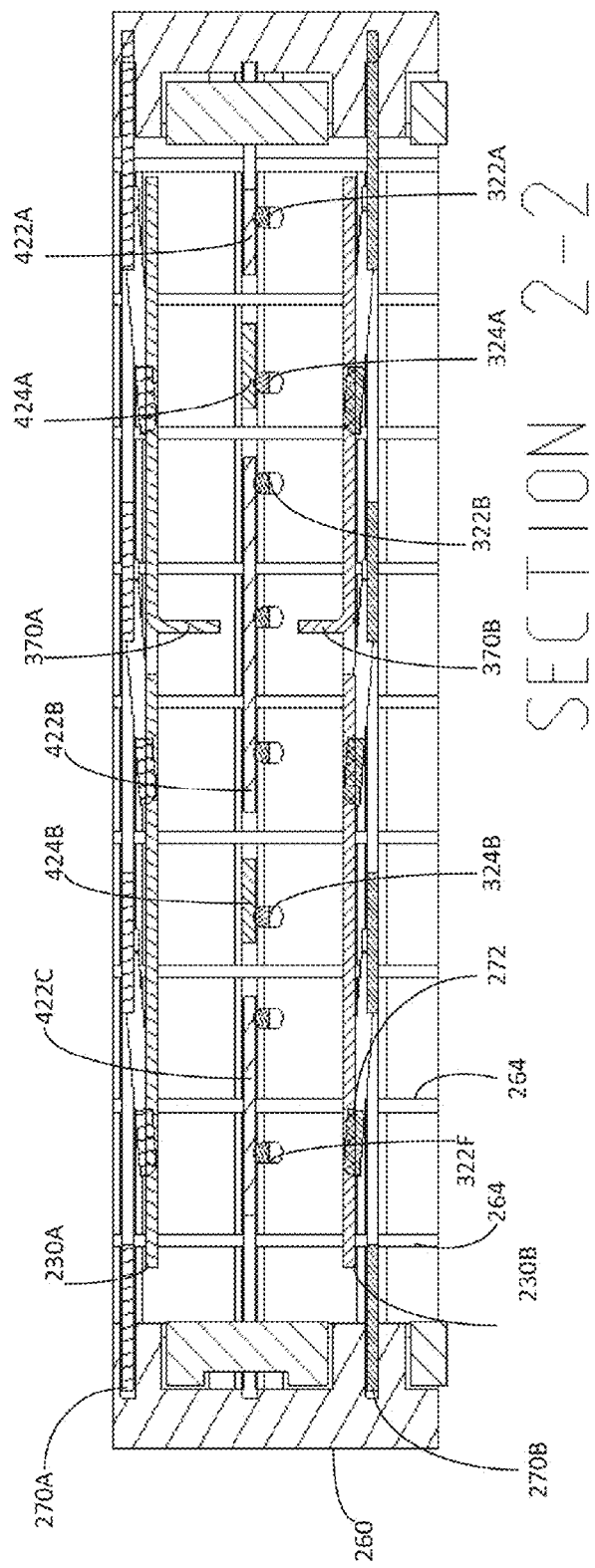
FIG. 12 is a cross-sectional view along the line 2-2 in FIG. 10.

FIG. 12 shows cross-section 2-2 through a mating interface portion of the mated connector modules. Mating contact 322A from connector module 210 is shown engaging conductive element 422A from connector module 250. Other mating contacts from connector module 210, of which mating contact 322B is numbered, are shown engaging conductive elements, of which conductive element 422B is numbered from connector module 250. Mating contacts from connector module 210, of which mating contact 322F is numbered, are shown engaging conductive element 422C from connector module 250.

Shield member 270B can be seen embedded in shroud 260. Contact 272, which is bent out of the plane of shield 270B, makes contact with shield member 230B. Similar contact is made between shield member 270A and shield member 230A. Tabs 370A and 370B extending from shield members 230A and 230B, respectively, are also visible. Tabs 370A and 370B may, as illustrated in FIG. 12, be positioned between adjacent signal conductors in a module, which may tend to reduce interference between the signal conductors.

Figure 13:
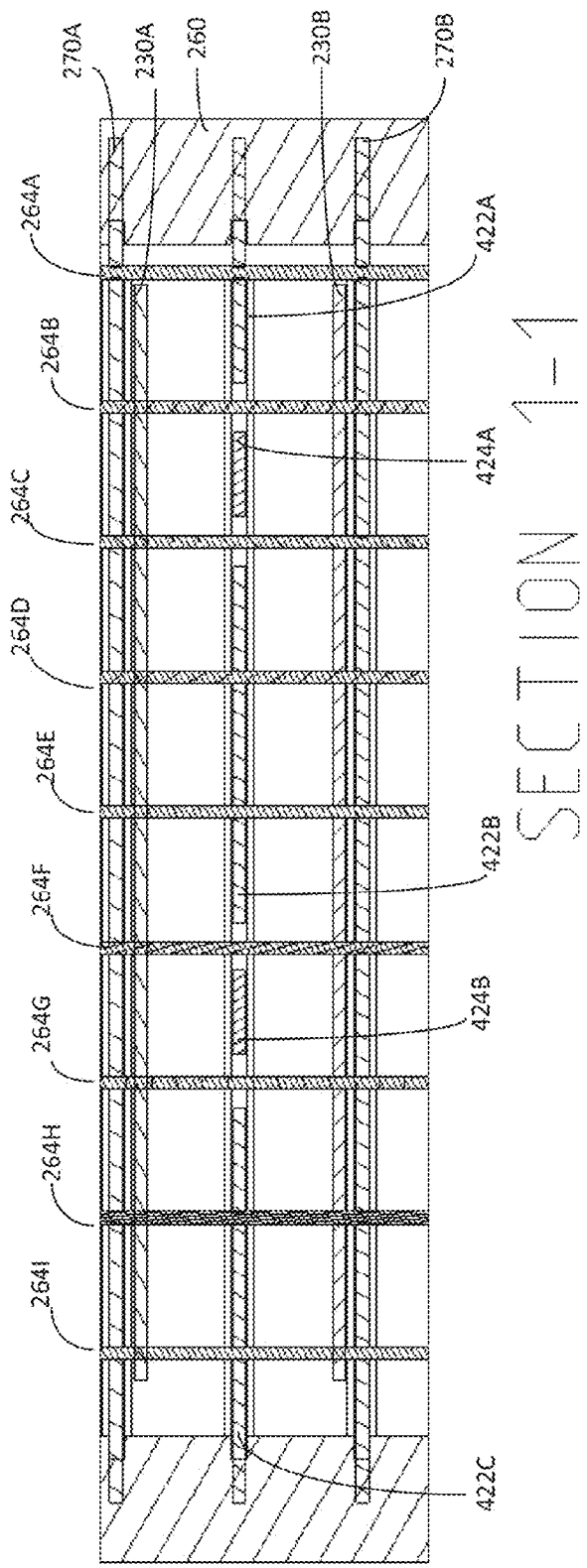
FIG. 13 is a cross-sectional view along the line 1-1 in FIG. 10.

FIG. 13 shows a cross section 1-1 through the mated connector modules. Cross section 1-1 passes through shroud 260. Multiple shield members 264, here numbered 264A, 264B . . . 264I, are visible. As can be seen, shield members 264A, 264B . . . 264I span the distance between shield members 270A and 270B. Shield members 264A, 264B . . . 264I are also in contact with shield members 2308 and 230B. Moreover, shield members 264A, 264B . . . 264I are also in contact with the conductive elements of backplane RF connector module 250 designated as ground conductors. Specifically, shield member 264A makes electrical contact with the conductive element 422A. Shield members 264D and 264E make electrical contact with conductive element 422B. Shield members 264H and 264I make electrical contact with conductive element 422C. With the conductive members forming ground conductors tied together in this way, resonances and other adverse electrical effects within the ground system are reduced.

The structure of the ground system may also provide a transition to a connector footprint that avoids abrupt impudence discontinuities, which may be undesirable for a connector carrying RF signals. In the cross-section illustrated in FIG. 13, the conductive elements 424A and 424B carrying RF signals do not have the coplanar waveguide structure illustrated in FIG. 11. However, conductive element 424A is surrounded by shield members 264B and 264C. Likewise, conductive element 424B is surrounded by shield members 264F and 264G. As can be seen, shield member 264B is approximately halfway between the edge of conductive element 424A and a facing edge of conductive element 422A. Similarly, shield member 264C is approximately halfway between an edge of conductive element 424A and a facing edge of conductive element 422B.

This positioning of planar ground members tends to create electromagnetic fields that approximate those that would exist in the vicinity of conductive element 424A as part of a coplanar waveguide structure. Though, the conductive structures serving as ground conductors surrounding conductive element 424A in this fashion more readily align with the conductive structures in a printed circuit board to which a backplane RF connector module may be attached. Examples of the conductive structures in a printed circuit board are provided in FIGS. 16 and 17, below. Similar alignment of conductive structures may be provided in signal launch regions, such as region 510B, where connector module 210 is attached to a printed circuit board.

Figure 14A:
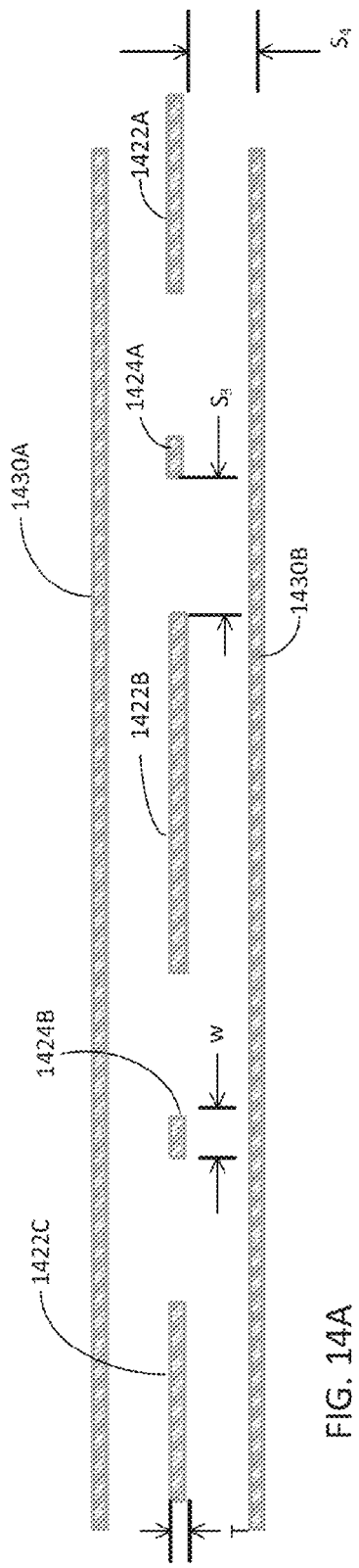
FIG. 14A is a cross-sectional view of conductive elements in an RF connector module with a coplanar waveguide configuration.
Figure 14B:
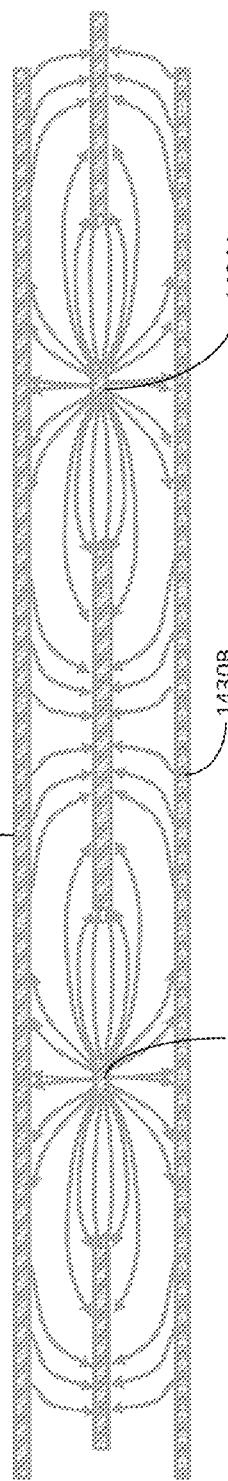
FIG. 14B is a cross-sectional view of the RF connector module of FIG. 14A showing electromagnetic fields associated with propagating RF signals.
Figure 14C:
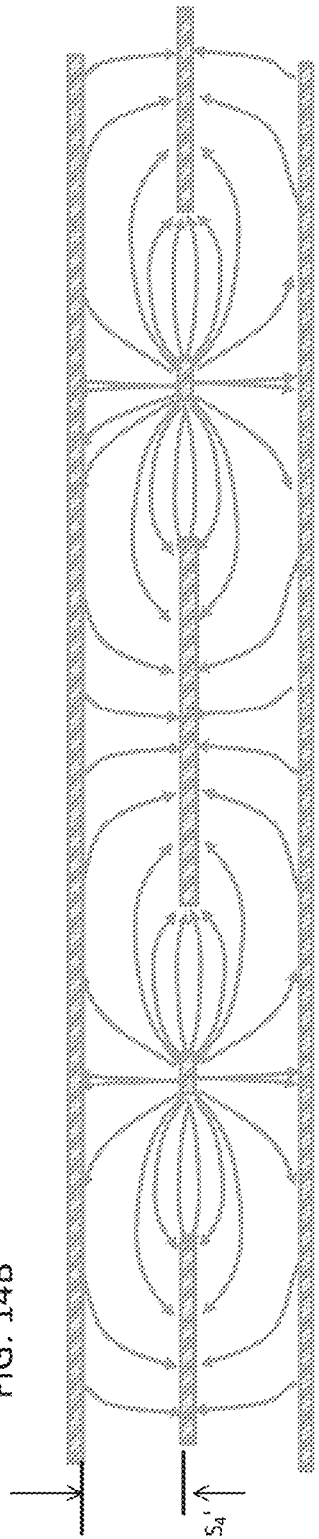
FIG. 14C is a cross-sectional view of conductive elements in an RF connector module with a coplanar waveguide configuration, as in FIG. 14A but with different dimensions, and showing electromagnetic fields associated with propagating RF signals.

FIGS. 14A, 14B and 14C illustrate parameters of a connector design that may be varied to achieve a desired impedance and level of isolation between signal conductors. FIG. 14A illustrates schematically a cross-section similar to that shown in FIG. 11. Signal conductors 1424A and 1424B are shown. Each of the signal conductors 1424A and 1424B is shown between two adjacent ground conductors 1422A, 1422B or 1422C. These conductive elements are stamped from the same sheet of metal and have a thickness, T. The signal conductors 1424A and 1424B have a width W, which in this example is the same for both signal conductors.

Each of the signal conductors 1424A and 1424B has an edge to edge spacing relative to an adjacent ground conductor of $S_3$. In this example, the edge to edge spacing for both edges of both signal conductors is the same. However, it should be appreciated that different signal conductors may have different edge to edge spacing relative to an adjacent ground and different edges of the same signal conductor may have different edge to edge spacing. The specific values for the dimensions T, W and $S_3$ may be selected to provide a desired impedance, or other property, for RF signals propagating along the signal conductors.

FIG. 14A shows that the conductive elements 1422A, 1424A, 1422B, 1424B, and 1422C are separated from adjacent shield members 1430A and 1430 be by a distance $S_4$. In this example, the distance relative to each shield member is the same. In other embodiments, the distance may be different.

FIG. 14B illustrates the electromagnetic fields in the vicinity of the signal conductors 1424A and 1424B when those signal conductors are carrying RF signals. As can be seen, the electromagnetic fields surrounding signal conductors 1424A and 1424B interact with shield members 1430A and 1430B. This condition may allow electromagnetic radiation associated with an RF signal to escape from shield members 1430A and 1430B, which may cause interference with adjacent RF signal conductors. Additionally, this configuration may allow propagation or resonance of electromagnetic energy along or between shield members 1430A and 1430B, which may reduce isolation between signal conductors 1424A and 1424B.

FIG. 14C illustrates that the amount of radiation interacting with shield members 1430A and 1430B may be reduced by increasing the distance $S_4$. In the embodiment of FIG. 14 C, that distance has been increased to distance $S_4'$. As can be seen by comparison of FIGS. 14B and 14C, a greater percentage of the electromagnetic energy associated with the propagating RF signal is concentrated between signal conductors 1424A and 1424B with increased distance to distance $S_4'$. Simultaneously, less RF energy is available to interact with the shield members or to otherwise cause interference between adjacent RF signal conductors.

Figure 15A:
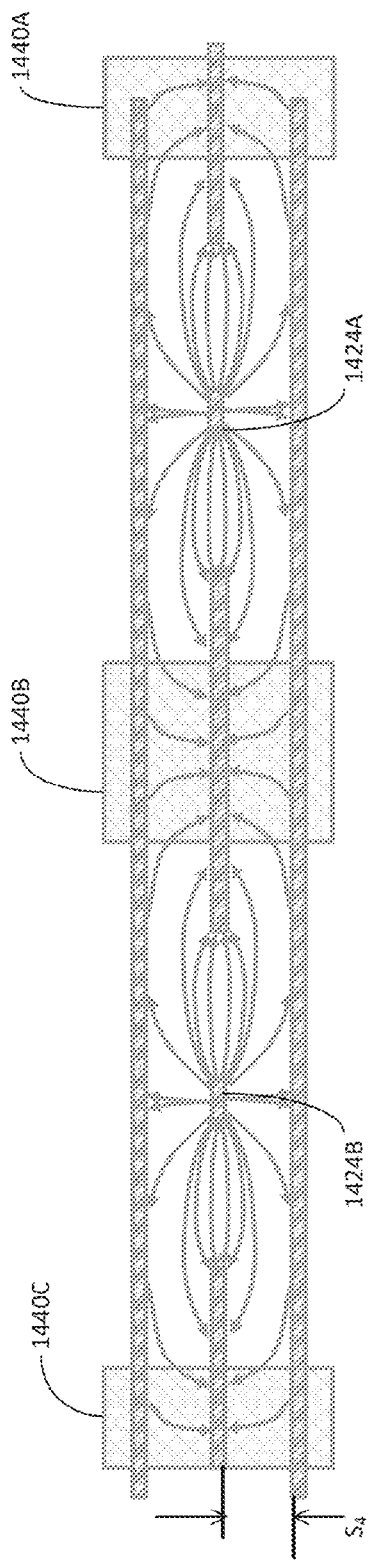
FIG. 15A is a cross-sectional view of conductive elements in an RF connector as in FIG. 14A and with lossy regions, and showing electromagnetic fields associated with propagating RF signals.

FIG. 15A illustrates a further technique that may be used to reduce interference between adjacent RF signal conductors. FIG. 15A illustrates the introduction of lossy regions 1440A, 1440B and 1440C into a connector module. As can be seen from a comparison of FIGS. 14B and 15A, introduction of the lossy regions reduces the amount of electromagnetic radiation associated with propagating RF signals outside the regions between the RF signal conductors 1424A or 1424B and the adjacent ground conductors forming the coplanar waveguide structures. In the embodiment illustrated, the lossy material is positioned to attenuate undesired modes of propagation, thereby enforcing the desired mode of propagation. Thus, the effect of introducing lossy material is to increase the percentage of the RF signal energy carried within the coplanar waveguide structures. For example, in some embodiments, greater than 85% of the signal energy may propagate along the coplanar waveguide. In other embodiments, this percentage may be 90%, 95% or 99% over a frequency range of interest, such as 1-3 GHz.

Figure 15B:
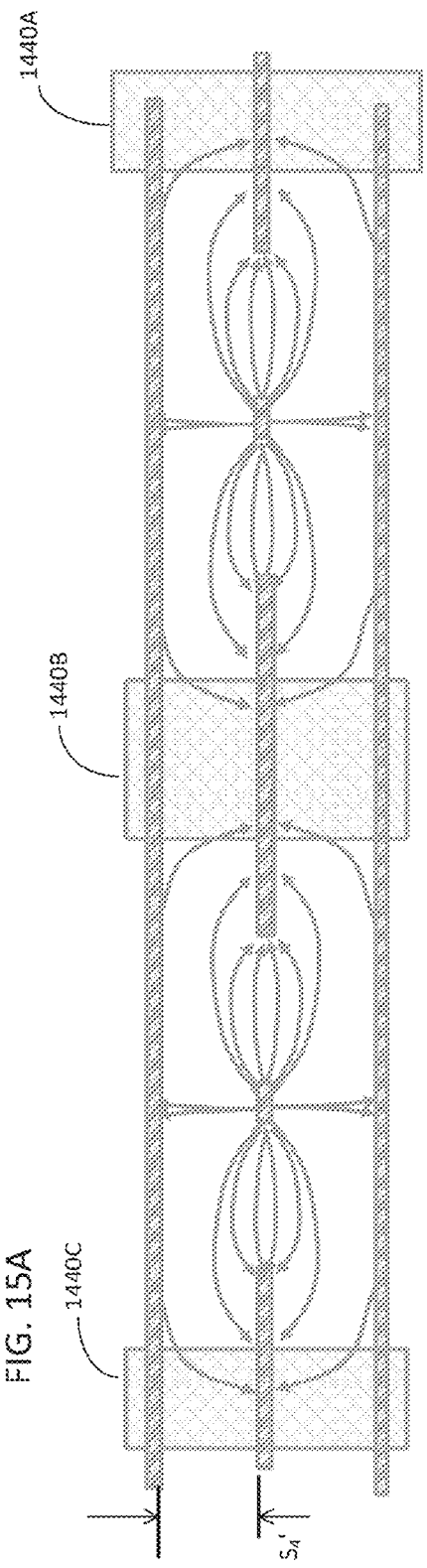
FIG. 15B is a cross-sectional view of conductive elements, lossy regions and electromagnetic fields associated with propagating RF signals in an RF connector module as in FIG. 15A, but with different dimensions.

FIG. 15B illustrates a further improvement that can be achieved by both increasing the distance to distance $S_4'$ and incorporating lossy regions. As a specific example, in some embodiments, the distances:

T may be between 0.05 mm and 0.15 mm.
W may be between 0.2 mm and 0.45 mm.
$S_3$ may be between 0.2 mm and 0.6 mm.
$S_4'$ may be 0.5 mm or greater.

Such dimensions may provide isolation between RF signals of that is in excess of 75 dB and in some embodiments may be even higher, such as in excess of 90 dB of isolation over a range of frequencies in the RF range, such as 1 GHz to 3 GHz. Such a connector may provide on impedance that is tunable, depending on the specific dimensions selected. The impedance, for example, may be tuned to be in the range of 40Ω to 80Ω at a frequency in the range of 1-3 GHz. Though, in other embodiments, the impedance may be tuned in the range of 45Ω to 55Ω over the frequency range of 3 GHz to 6 GHz or 65Ω to 85Ω over the frequency range of 3 GHz to 6 GHz.

In addition to the design features for the connector modules described above, other aspects of an interconnection system may impact isolation between RF signal conductors or other performance parameters. One such aspect is the technique used for mounting the connector modules to printed circuit boards. A location of a printed circuit board at which a connector is mounted is sometimes called the connector "footprint". FIG. 16 illustrates a connector footprint for a connector containing two RF modules described above.

The footprint illustrated in FIG. 16 may be appropriate for mounting two modules in the form of right angle RF signal module 210. In some embodiments, the connector modules may be manufactured such that the same footprint may also be used for mounting modules in the form of backplane RF connector module 250. Though, even if the footprint for a backplane module 250 is not identical to that used for mounting of a connector module 210, similar techniques may be used to construct the footprint.

In this example, the connector footprint contains module regions 1610A and 1610B. Each of the module regions is configured for receiving contact tails from one connector module. In the illustrated example, the contact tails are configured as press fit contact tails and are inserted into plated vias. Accordingly, each of the module regions 1610A and 1610B contains plated vias for receiving contact tails from signal conductors and associated ground conductors.

In the embodiments described above, each of the conductor modules contains two RF signal conductors. Accordingly, each of the module regions 1610A and 1610B contains two signal vias 1620A and 1620B, each adapted to receive a contact tail from an RF signal conductor. Vias adapted to receive contact tails from associated ground conductors may be positioned around each of vias 1620A and 1620B. Ground vias 1630A, 1632A, 1634A, 1636A, 1638A and 1640A are shown positioned around signal via 1620A. Ground vias 1630B, 1632B, 1634B, 1636B, 1638B and 1640B are shown positioned around signal via 1620B. Each signal via and associated ground vias may form a signal launch for an RF signal and may receive contact tails from a signal launch region, such as signal launch region 510B (FIG. 5).

As shown in FIG. 16, the ground vias are positioned generally in a circle around the signal vias. The radius of this circle may be selected to provide a desired impedance in the signal launch. The impedance, for example, may approximate the impedance for which the connector module is tuned.

The signal vias and ground vias may be constructed in any suitable way, including using known printed circuit board manufacturing techniques. Those techniques may include drilling a hole through a printed circuit board and then plating the interior walls of the hole with a conductive material. To form a signal via, the whole may be drilled through a signal trace within the printed circuit board on which the connector footprint is formed. If the signal via passes through other layers of the printed circuit board, any conductive material on those layers is positioned so that the hole will not pass through the conductive material, unless that conductive material is to be connected to the signal trace.

To form a ground via, the via may be drilled through one or more conductive layers within the printed circuit board that are connected to ground. When the ground via is plated, connection to ground is completed.

The diameters of the signal vias and ground vias may be selected such that press fit contact tails will fit snugly within the vias, making electrical and mechanical connections to the plating on the interior portions of the vias. Additionally, micro vias may be included in the connector footprint. Micro vias are vias that have a smaller diameter than signal and ground vias. The micro vias do not necessarily receive a contact tail. Rather, the micro vias may be included to shape the electromagnetic fields in the footprint.

FIG. 16 shows micro vias of which micro vias 1650 is numbered. In the embodiment illustrated, the micro vias 1650 are positioned in two parallel lines 1652 and 1654. Lines 1652 and 1654 of micro vias may reduce interference between RF signal conductors within module regions 1610A and 1610B. In some embodiments, lines 1652 and 1654 of micro vias may align with shield members 230A and 230B, respectively, when connector module 210 is mounted at the connector footprint.

Micro vias may also be arranged in a field 1656 between signal vias in the same module region. Field 1656 of micro vias may reduce interference between signal conductors in the same module region.

In addition to providing a desired impedance and limiting interference between signal conductors, the footprint illustrated in FIG. 16 may accommodate single layer routing of RF signal traces within a printed circuit board. FIG. 16 illustrates a signal trace 1660A connected to signal via 1620A. A signal trace 1660B is connected to signal via 1620B. In constructing a printed circuit board, the signal traces may run on an interior layer of the printed circuit board. Though FIG. 16 may be regarded as representing a surface of the printed circuit board, FIG. 16 also may be regarded as representing any layer of the printed circuit board, including a layer on which the signal traces are routed.

As can be seen in FIG. 16, the signal traces 1660A and 1660B carrying RF signals to all of the connector modules can be routed to the signal vias within the connector footprint without crossing one another. Because crossing signal traces generally requires that the traces be implemented on different layers of a printed circuit board, routing all of the signal traces to the signal vias within the connector footprint without crossing traces means that all of the signal traces may be implemented on a single layer. In conventional design of a printed circuit board that carries RF signals, it is sometimes desirable for all the RF signal traces to be implemented on a single layer, frequently an outermost layer of the printed circuit board. Accordingly, the footprint illustrated in FIG. 16 is compatible with conventional RF printed circuit board design techniques.

Turning to FIG. 17, a variation of a connector footprint is illustrated. The footprint of FIG. 17 includes RF signal launch regions similar to those illustrated in connection with FIG. 16. The footprint of FIG. 17 differs from the footprint of FIG. 16 in that un-plated vias, such as un-plated vias 1770A, 1772A, 1774A or 1776A have been positioned around signal via 1720A. Similar un-plated vias 1770B, 1772B, 1774B or 1776B may be positioned around signal via 1720B. The number, size and/or position of the un-plated vias may be selected to provide a desired impedance for each RF signal launch. Such an approach may be useful in embodiments in which other factors constrain positioning of structures in the footprint that might yield a different impedance than desired.

The ground vias in the connector footprint may align with the contact tails, which may be positioned with a spacing driven by the spacing between shield members. As a result, the configuration of the signal launch region 510B on the connector module and the configuration of the ground vias in the connector footprint may be related such that positioning of the ground vias may be influenced by parameters of the design of the connector module. Incorporating un-plated vias in the connector footprint allows the impedance of the signal launch to be adjusted to a desired value that might not be achieved given the placement of the ground vias to receive contact tails from the connector module.

In the embodiment illustrated in FIG. 17, four un-plated vias are illustrated in the vicinity of each signal launch. For example, un-plated vias 1770A, 1772A, 1774A and 1776A may be positioned equidistant from signal via 1720A. The un-plated vias 1770A, 1772A, 1774A and 1776A in this example are between signal via 1720A and ground vias 1730A, 1732A, 1734A, 1736A, 1738A and 1740A. Though, any suitable number and positioning of un-plated vias may be used.

The un-plated vias may be made in any suitable way. As one example, the un-plated vias may be formed by drilling holes through the printed circuit board after plating of plated vias has been performed. Though, in other embodiments, the un-plated vias may be drilled before or as part of the same manufacturing operation as the plated vias. The un-plated vias may then be temporarily or permanently filled or coated with material that blocks the conductive plating from adhering to the walls of the un-plated vias. The un-plated vias, for example, may be filled with a material of low dielectric constant relative to the material that is used to form the matrix of the printed circuit board. This material may remain in the un-plated vias or may be removed, leaving air in the un-plated via, or removed and replaced with some other material.

As an additional difference relative to the footprint of FIG. 16, the footprint of FIG. 17 does not include field 1656 of micro vias. FIG. 17 provides an example of a number and arrangement of micro vias that may be appropriate in some embodiments. However, it should be recognized that in other embodiments other numbers or arrangements of micro vias may be used.

Various inventive concepts disclosed herein are not limited in their applications to the details of construction and the arrangements of components set forth in the following description or illustrated in the drawings. The inventive concepts are capable of other embodiments and of being practiced or of being carried out in various ways. Also, the phraseology and terminology used herein is for the purpose of description and should not be regarded as limiting. The use of "including," "comprising," "having," "containing," or "involving," and variations thereof herein, is meant to encompass the items listed thereafter and equivalents thereof as well as additional items.

Having thus described several aspects of at least one embodiment of the present disclosure, it is to be appreciated various alterations, modifications, and improvements will readily occur to those skilled in the art.

While examples of specific arrangements and configurations are shown and discussed herein, it should be appreciated that such examples are provided solely for purposes of illustration, as various inventive concepts of the present disclosure are not limited to any particular manner of implementation. For example, aspects of the present disclosure are not limited to any particular number of wafers in a connector, nor to any particular number or arrangement of signal conductors and ground conductors in each wafer of the connector.

As an example, coupling to lossy regions is described by way of contact. In some embodiments, capacitive coupling or other forms of indirect coupling may be used such that coupling is possible even without direct or ohmic contact Further, although many inventive aspects are shown and described with reference to a right angle connector, it should be appreciated that the present invention is not limited in this regard, as the inventive concepts may be included in other types of electrical connectors, such as mezzanine connectors, cable connectors, stacking connectors, power connectors, flexible circuit connectors, right angle connectors, or chip sockets.

As a further example, connectors with two RF signal conductors in a column were used to illustrate the inventive concepts. However, the connectors with any desired number of signal conductors may be used.

Further, embodiments were illustrated in which connectors may be mounted using press fit attachment techniques. To support such attachment, the contact tails may be shaped as eye of the needle contacts or otherwise contain compliant sections that can be compressed upon insertion into a hole on a surface of a printed circuit board. In other implementations, the contact tails may be shaped to receive solder balls such that a connector may be mounted to a printed surface board using known surface mount assembly techniques. Other connector attachment mechanisms alternatively or additionally may be used and contact tails of connectors may be shaped to facilitate use of alternative attachment mechanisms. For example, to support surface mount techniques in which component leads are placed on solder paste deposited on the surface of a printed circuit board, the contact tails may be shaped as pads. As a further alternative, the contact tails may be shaped as posts that engage holes on the surface of the printed circuit board.

In the embodiments illustrated, some conductive elements are designated as forming signal conductors and some conductive elements are designated as ground conductors. These designations refer to the intended use of the conductive elements in an interconnection system as they would be understood by one of skill in the art. For example, though other uses of the conductive elements may be possible, signal conductors may be identified based on isolation from other like conductive elements. Electrical characteristics of the signal conductors, such as its impedance, that make it suitable for carrying a signal may provide an alternative or additional method of identifying a signal conductor. For example, a signal conductor may have an impedance of between 50 Ohms and 100 Ohms. As a specific example, a signal may have an impedance of 50 or 100 Ohms+/−10%. As another example of differences between signal and ground conductors, ground conductors may be identified by their positioning relative to the signal conductors. In other instances, ground conductors may be identified by their shape or electrical characteristics. For example, ground conductors may be relatively wide to provide low inductance, which is desirable for providing a stable reference potential, but provides an impedance that is undesirable for carrying a high speed signal.

Further, though designated a ground conductor, it is not a requirement that all, or even any, of the ground conductors be connected to earth ground. In some embodiments, the conductive elements designated as ground conductors may be used to carry power signals or low frequency signals. For example, in an electronic system, the ground conductors may be used to carry control signals that switch at a relatively low frequency. In such an embodiment, it may be desirable for the lossy member not to make direct electrical connection with those ground conductors. The ground conductors, for example, may be covered by the insulative portion of a wafer adjacent the lossy member.

Further, lossy material is described as being positioned such that it suppresses undesired modes of propagation. Alternatively or additionally, the lossy material may be positioned such that it increases the bandwidth of the connector.

Such alterations, modifications, and improvements are intended to be part of this disclosure, and are intended to be within the spirit and scope of the invention. Accordingly, the foregoing description and drawings are by way of example only.

What is claimed is:

1. A printed circuit board comprising a footprint for an RF connector module, the printed circuit board comprising:
   a matrix comprising material of a first dielectric constant;
   a signal trace supported by the matrix;
   a conductive structure, parallel to and isolated from the signal trace by the matrix;
   a first via connected to the signal trace within the printed circuit board;
   a plurality of second vias electrically coupled through the conductive structure, the plurality of second vias being disposed around the first via;
   a plurality of third vias, the third vias being disposed in a region of the printed circuit board between the first via and the plurality of second vias, the third vias have a second dielectric constant different than the first dielectric constant.

2. The printed circuit board of claim 1, wherein the plurality of second vias are spaced the same distance from the first via.

3. The printed circuit board of claim 2, further comprising a plurality of micro vias disposed in first column and a second column, parallel to the first column, the first column and the second column being on opposing sides of the first via.

4. The printed circuit board of claim 3, wherein:
   the printed circuit board comprises a first signal launch region comprised of:
      the signal trace;
      the first via;
      the plurality of second vias; and
      the plurality of third vias; and
   the printed circuit board further comprises a second, like signal launch region, wherein the first via of the second signal launch region is disposed between the first column and the second column.

5. The printed circuit board of claim 4, wherein the first via, the second vias and the third vias are sized and positioned to provide an impedance in the first signal launch region and the second signal launch region of between 40Ω and 80Ω.

6. The printed circuit board of claim 3, in combination with an RF connector module, wherein:
   the RF connector module comprises:
      a lead frame providing a coplanar waveguide structure, the lead frame comprising:
         a signal conductor, the signal conductor comprising a contact tail; and
         a plurality of ground conductors disposed adjacent the signal conductor, the plurality of ground conductors comprising a plurality of contact tails; and
      at least one shield member parallel to the lead frame;
   the contact tail of the signal conductor is connected to the first via; and
   each of the plurality of contact tails of the plurality of ground conductors is connected to a second via.

* * * * *